(12) United States Patent
Cao et al.

(10) Patent No.: US 12,213,327 B2
(45) Date of Patent: Jan. 28, 2025

(54) CHARGE OR ELECTRICITY GENERATING DEVICES AND METHODS OF MAKING AND USE THEREOF

(71) Applicant: Ohio State Innovation Foundation, Columbus, OH (US)

(72) Inventors: Lei Raymond Cao, Columbus, OH (US); Lei Pan, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 161 days.

(21) Appl. No.: 17/921,522

(22) PCT Filed: Jun. 9, 2021

(86) PCT No.: PCT/US2021/036574
§ 371 (c)(1),
(2) Date: Oct. 26, 2022

(87) PCT Pub. No.: WO2021/252601
PCT Pub. Date: Dec. 16, 2021

(65) Prior Publication Data
US 2023/0207149 A1 Jun. 29, 2023

Related U.S. Application Data

(60) Provisional application No. 63/036,785, filed on Jun. 9, 2020.

(51) Int. Cl.
*H10K 30/50* (2023.01)
*G21G 4/04* (2006.01)
*G21H 1/06* (2006.01)
*G21H 1/12* (2006.01)
*G21H 3/02* (2006.01)
*H10K 30/85* (2023.01)
(Continued)

(52) U.S. Cl.
CPC ............... *H10K 30/50* (2023.02); *G21G 4/04* (2013.01); *G21H 1/06* (2013.01); *G21H 1/12* (2013.01); *G21H 3/02* (2013.01); *H10K 30/85* (2023.02); *H10K 50/813* (2023.02); *H10K 50/822* (2023.02); *H10K 59/60* (2023.02); *H10K 85/30* (2023.02); *H10K 85/50* (2023.02); *H10K 2102/20* (2023.02)

(58) Field of Classification Search
CPC .......... H10K 30/50; H10K 30/84; G21H 1/12
See application file for complete search history.

(56) References Cited

U.S. PATENT DOCUMENTS 6,781,132 B2    8/2004   McGregor
6,921,903 B2    7/2005   McGregor
(Continued)

FOREIGN PATENT DOCUMENTS

CN    107093486 A    8/2017
WO    2016053413 A1    4/2016

OTHER PUBLICATIONS

English machine translation of CN107093486A. (Year: 2017).*
(Continued)

*Primary Examiner* — Lindsey A Buck
(74) *Attorney, Agent, or Firm* — Meunier Carlin & Curfman LLC

(57) ABSTRACT

Disclosed herein are charge or electricity generating devices and methods of making and use thereof.

18 Claims, 10 Drawing Sheets

(51) Int. Cl.
  *H10K 50/813* (2023.01)
  *H10K 50/822* (2023.01)
  *H10K 59/60* (2023.01)
  *H10K 85/30* (2023.01)
  *H10K 85/50* (2023.01)
  *H10K 102/20* (2023.01)

(56) References Cited

U.S. PATENT DOCUMENTS

| | | |
|---|---|---|
| 7,164,138 B2 | 1/2007 | McGregor et al. |
| 7,855,372 B2 | 12/2010 | McGregor et al. |
| 7,939,986 B2 | 5/2011 | Chandrashekhar et al. |
| 8,178,384 B1 | 5/2012 | Roscheisen et al. |
| 8,778,715 B2 | 7/2014 | Bellinger et al. |
| 8,969,900 B2 | 3/2015 | Sabathil et al. |
| 9,105,776 B2 | 8/2015 | Lee |
| 9,151,853 B2 | 10/2015 | Pahal et al. |
| 9,406,833 B2 | 8/2016 | Dahal et al. |
| 9,966,503 B2 | 5/2018 | Straßburg et al. |
| 10,451,751 B2 | 10/2019 | Cao |
| 2007/0080605 A1 | 4/2007 | Chandrashekhar et al. |
| 2014/0021827 A1 | 1/2014 | Noyes |
| 2014/0264256 A1 | 9/2014 | Nikolic et al. |
| 2015/0028217 A1 | 1/2015 | Zaitseva et al. |
| 2015/0357591 A1 | 12/2015 | Karunadasa et al. |
| 2016/0049585 A1 | 2/2016 | Lin et al. |
| 2016/0356901 A1 | 12/2016 | Shao et al. |

OTHER PUBLICATIONS

International Searching Authority (ISA/US). International Search Report and Written Opinion. PCT Application No. PCT/US2021/036574. Issued on Sep. 14, 2021. 11 pages.

Alam, et al., "Principles of Betavoltaic Battery Design", Journal of Energy, 2016, 3(1), 11-41.

Cheng, et al., "A high open-circuit voltage gallium nitride betavoltaic microbattery", Journal of Micromechanics and Microengineering, 2012, 22(7), 074011.

Dixon, et al., "Evaluation of a Silicon 90Sr Betavoltaic Power Source", Sci. Rep. 2016, 6, 38182.

Dong et al. "Electron-hole diffusion lengths > 175 μm in solution-grown CH3NH3PbI3 single crystals," Science, 2015, 347(6225), 967-970.

Lu, et al., "Gallium Nitride for Nuclear Batteries", Advanced Materials Research, 2012, 343-344, 56-61.

Munson, et al., "Model of Ni-63 battery with realistic PIN structure", Journal of Applied Physics, 2015, 118, 105101.

Olsen, et al., "Betavoltaic power sources", Phys. Today, 2012, 65, 35-38.

Panferov, et al., "Modeling Quantum Efficiency of Ultraviolet 6H—SiC Photodiodes", IEEE Transactions on Electron Devices, 2011, 58(11), 3976-3983.

Prelas, et al., "A review of nuclear batteries", Progress in Nuclear Energy 2014, 75, 117-148.

Song et al. "Perovskite-Betavoltaic Cells: A Novel Application of Organic-Inorganic Hybrid Halide Perovskites," ACS Appl. Mater. Interfaces 2019, 11, 32969-32977.

Wei et al. "Sensitive X-ray detectors made of methylammonium lead tribromide perovskite single crystals," Nature Photonics, 2016, 10, 333-339.

Yang et al. "Organohalide Lead Perovskites: More Stable than Glass under Gamma-Ray Radiation," Advanced Materials 2019, 31(4). 1805547.

\* cited by examiner

CHARGE OR ELECTRICITY GENERATING DEVICES AND METHODS OF MAKING AND USE THEREOF

CROSS-REFERENCE TO RELATED APPLICATIONS

This application is a national stage application filed under 35 U.S.C. § 371 of PCT/US2021/036574 filed Jun. 9, 2021, which claims the benefit of priority to U.S. Provisional Application No. 63/036,785 filed Jun. 9, 2020, which is hereby incorporated herein by reference in its entirety.

STATEMENT OF GOVERNMENT SUPPORT

This invention was made with government support under Grant No. HDTRA1-17-1-0054 awarded by the U.S. Department of Defense, Defense Threat Reduction Agency (DTRA). The government has certain rights in the invention.

BACKGROUND

There are many areas where a robust, long-term, low-maintenance, and an alternative for photovoltaic or thermoelectric power supply is needed, such as outer space exploration (e.g., interplanetary and interstellar exploration), implantable medical devices (IMD) (e.g., pacemakers), and applications that involve harsh environment operation of the battery in locations with little or no sunlight (e.g., deep sea exploration, interplanetary and interstellar exploration, polar explorations, military equipment). For example, for outer space exploration applications, only a small percentage of sunlight reaches the outer perimeter of the solar system making solar power unfeasible. Furthermore, it is almost impossible to access the devices for outer space exploration once launched, therefor the device must function reliably over a long period of time without being accessed for recharge or maintenance. Similarly, for any device that is difficult and/or dangerous to access, the device must function reliably over a long period of time without being accessed for recharge or maintenance. For both space exploration and implantable medical devices, it is further desirable for the power source to be small in size. However, in other applications where either a small or large scale power supply is needed at night or in a no-sunlight environment, it is desired to design a solar farm that can work for 24-hours a day (e.g., including at night/in the absence of sunlight). The devices and methods discussed herein address these and other needs.

SUMMARY

In accordance with the purposes of the disclosed compositions, devices, and methods as embodied and broadly described herein, the disclosed subject matter relates to charge or electricity generating devices and methods of making and use thereof.

Additional advantages of the disclosed compositions, devices, and methods will be set forth in part in the description which follows, and in part will be obvious from the description. The advantages of the disclosed compositions, devices, and methods will be realized and attained by means of the elements and combinations particularly pointed out in the appended claims. It is to be understood that both the foregoing general description and the following detailed description are exemplary and explanatory only and are not restrictive of the disclosed systems and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
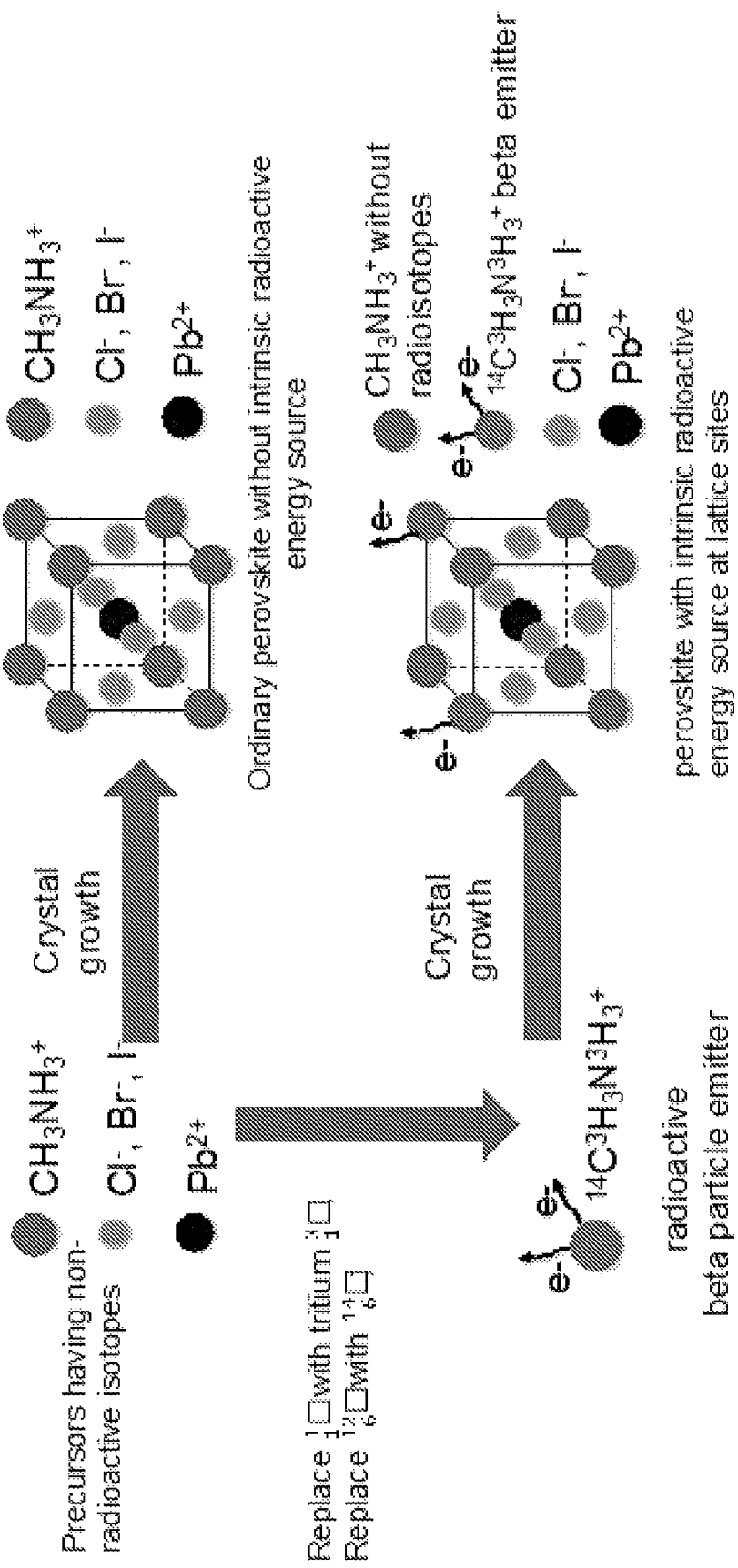
FIG. 1 is a schematic diagram showing a comparison of the crystal structures for ordinary non-radioactive perovskites to a perovskite with an intrinsic radioactive energy source incorporated within the crystal lattice.

The compositions, devices, methods, and systems described herein may be understood more readily by reference to the following detailed description of specific aspects of the disclosed subject matter and the Examples included therein.

Before the present compositions, devices, methods, and systems are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

"Exemplary" means "an example of" and is not intended to convey an indication of a preferred or ideal embodiment. "Such as" is not used in a restrictive sense, but for explanatory purposes.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Disclosed herein are charge or electricity generating devices and methods of making and use thereof. For example, disclosed herein are charge or electricity generating devices comprising: a first electrode; an electron transport layer; a perovskite layer; a hole transport layer; and a second electrode; wherein the electron transport layer is disposed between the first electrode and the perovskite layer such that the electron transport layer is in physical contact with the first electrode and the perovskite layer; wherein the perovskite layer is disposed between the electron transport layer and the hole transport layer such that the perovskite layer is in physical contact with the electron transport layer and the hole transport layer; wherein the hole transport layer is disposed between the second electrode and the perovskite layer such that the hole transport layer is in physical contact with the perovskite layer and the second electrode; wherein the perovskite layer comprises a perovskite having a crystal lattice comprising a plurality of atoms, wherein at least a portion of the plurality of atoms within the crystal lattice of the perovskite comprise a radioactive isotope having a half-life of 100 days or more, wherein each radioactive isotope replaces one atom that is a non-radioactive counterpart of the radioactive isotope, such that the perovskite intrinsically comprises one or more radioactive isotopes in its crystal lattice (e.g., 2 or more, 3 or more, 4 or more, 5 or more, 6 or more, 7 or more, 8 or more, 9 or more, or 10 or more). The radioactive isotope can, for example, emit alpha particles, beta particles, gamma photons, or a combination thereof. The charge or electricity generating devices can, for example, generate charge or electricity upon decay of the one or more radioisotopes. For example, decay of the one or more radioactive isotopes can generate an electron-hole pair (e.g., one or more electron-hole pairs) in the perovskite, which can then be transported out of the perovskite through the ETL and HTL, respectively, to generate charge or electricity.

The electron transport layer can comprise any suitable material, such as those known in the art. In some examples, the electron transport layer can comprise 2,4,6-Tris(3-(pyrimidin-5-yl)phenyl)-1,3,5-triazine (TPM-TAZ); 8-Hydroxyquinolinolato-lithium (Liq); 1,3,5-Tris(1-phenyl-1H-benzimidazol-2-yl)benzene (TPBi); Bis(2-methyl-8-quinolinolate)-4-(phenylphenolato)aluminum (BAlq); 1,3-Bis[2-(2,2'-bipyridine-6-yl)-1,3,4-oxadiazo-5-yl]benzene (Bpy-OXD); 6,6'-Bis[5-(biphenyl-4-yl)-1,3,4-oxadiazo-2-yl]-2,2'-bipyridyl (BP-OXD-Bpy); 3-(4-Biphenyl)-4-phenyl-5-tert-butylphenyl-1,2,4-triazole (TAZ); 4-(Naphthalen- 1-yl)-3,5-diphenyl-4H-1,2,4-triazole (NTAZ); 2,9-Bis(naphthalen-2-yl)-4,7-diphenyl-1,10-phenanthroline (NBPhen); 2,7-Bis[2-(2,2'-bipyridine-6-yl)-1,3,4-oxadiazo-5-yl]-9,9-dimethylfluorene (Bpy-FOXD); I-Methyl-2-(4-(naphthalen-2-yl)phenyl)-1H-imidazo[4,5f][1,10]phenanthroline (2-NPIP); 2-(Naphthalen-2-yl)-4,7-diphenyl-1,10-phenanthroline (HNBphen); Phenyl-dipyrenylphosphine oxide (POPy2); 4,4'-Bis(4,6-diphenyl-1,3,5-triazin-2-yl)biphenyl (BTB); 1,3-Bis[3,5-di(pyridin-3-yl)phenyl]benzene (BmPyPhB); 2-(4-(9,10-Di(naphthalen-2-yl)anthracen-2-yl)phenyl)-1-phenyl-1H-phenanthro[9,10-d]imidazole (Bepq2); Diphenylbis(4-(pyridin-3-yl)phenyl)silane (DPPS); 3,5-Di(pyren-1-yl)pyridine (PY1); 1,3,5-Tri(p-pyrid-3-yl-phenyl)benzene (TpPyPB); 2,4,6-Tris(3'-(pyridin-3-yl)biphenyl-3-yl)-1,3,5-triazine (TmPPPyTz); 4,6-Bis(3,5-di(pyridin-3-yl)phenyl)-2-methylpyrimidine (B3PYMPM); 1,3,5-Tris(4-(pyridin-4-yl)quinolin-2-yl)benzene (TPyQB); 4,6-Bis(3,5-di(pyridin-4-yl)phenyl)-2-methylpyrimidine (B4PYMPM); 2,7-Di(2,2'-bipyridin-5-yl)triphenylene (BPy-TP2); 2,2'-(4,4'-(Phenylphosphoryl)bis(4,1-phenylene))bis(1-phenyl-1H-benzo[d]imidazole) (BIPO); Lithium 2-(2',2''-bipyridine-6'-yl) phenolate (Libpp); 4,6-Bis(3,5-di(pyridin-4-yl)phenyl)-2-phenylpyrimidine; (B4PYPPM); 1,3,5-Tris(6-(3-(pyridin-3-yl)phenyl)pyridin-2-yl)benzene (Tm3PyP2PyB); 4,6-Bis(3,5-di(pyridin-3-yl)phenyl)-2-(pyridin-3-yl)pyrimidine (B3P-YPPM); 4,6-Bis(3,5-di(pyridin-4-yl)phenyl)-2-(3-(pyridin-3-yl)phenyl)pyrimidine (B4PYPPyPM); 1,3,5-Tri(diphenylphosphoryl-phen-3-yl) benzene (TP3PO); Poly[9,9-bis[6'-(N,N,N-trimethylammonium)hexyl]fluorene-alt-co-1,4-phenylene]bromide (FPQ-Br); 8-Hydroxyquinoline sodium salt (NaQ); 4,7-Diphenyl-2-(4-(1-phenyl-1H-benzo[d]imidazol-2-yl)phenyl)-1,10-Phenanthroline (BimiBphen); 4,7-Diphenyl-2,9-bis(4-(1-phenyl-1H-benzo[d]imidazol-2-yl)phenyl)-1,10-Phenanthroline (DBimiBphen); 2,4,6-Tris[3-(diphenylphosphinyl)phenyl]-1,3,5-triazine (POT2T); 2,4,6-tris(biphenyl-3-yl)-1,3,5-triazine (T2T); bathophenanthroline (BPhen); Tris(8-hydroxy-quinolinato)aluminum (Alq3); tris(2,4,6-trimethyl-3-(pyridine-3-yl)phenyl)borane (3TPYMB); derivatives thereof, or combinations thereof. In some examples, the electron transport layer can comprise bathophenanthroline (BPhen); 2,9-Bis(naphthalen-2-yl)-4,7-diphenyl-1,10-phenanthroline (NBPhen); 4,6-Bis(3,5-di(pyridin-3-yl)phenyl)-2-methylpyrimidine (B3PYMPM); 4,6-Bis(3,5-di(pyridin-4-yl)phenyl)-2-methylpyrimidine (B4PYMPM); 1,3,5-Tris(1-phenyl-1H-benzimidazol-2-yl) benzene (TPBi); Tris(8-hydroxy-quinolinato)aluminum (Alq3); 2,4,6-Tris[3-(diphenylphosphinyl)phenyl]-1,3,5-triazine (POT2T); 2,4,6-tris(biphenyl-3-yl)-1,3,5-triazine (T2T); 1,3,5-Tri(p-pyrid-3-yl-phenyl)benzene (TpPyPB); tris(2,4,6-trimethyl-3-(pyridine-3-yl)phenyl)borane (3TP-YMB); a fullerene derivative; $C_{60}$; 2,9-Dimethyl-4,7-diphenyl-1,10-phenanthroline (Bathocuproine or BCP); derivatives thereof; or combination thereof. In some examples, the electron transport layer can comprise a metal oxide, for example an oxide of titanium, tin, zinc, niobium, tantalum, tungsten, indium, gallium, neodymium, barium, palladium or cadmium, or a mixture thereof. For instance, the electron transport layer can comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, $CdO$, $BaTiO_3$, $BaTiO_3/TiO_2$, or combinations thereof.

In some examples, the electron transport layer can have an average thickness of 10 nm or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 550 nm or more, 600 nm or more, 650 nm or more, 700 nm or more, 750 nm or more, 800 nm or more, 850 nm or more, or 900 nm or more). In some examples, the electron transport layer can have an average thickness of 1000 nm or less (e.g., 950 nm or less, 900 nm or less, 850 nm or less, 800 nm or less, 750 nm or less, 700 nm or less, 650 nm or less, 600 nm or less, 550 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, or 20 nm or less). The average thickness of the electron transport layer can range from any of the minimum values described above to any of the maximum values described above. For example, the electron transport layer can have an average thickness from 10 nm to 1000 nm (e.g., from 10 nm to 500 nm, from 500 nm to 1000 nm, from 10 nm to 200 nm, from 200 nm to 400 nm, from 400 nm to 600 nm, from 600 nm to 800 nm, from 800 nm to 1000 nm, from 10 nm to 100 nm, from 100 nm to 1000 nm, from 20 nm to 1000 nm, from 10 nm to 900 nm, or from 20 nm to 900 nm). In some examples, the average thickness of the electron transport layer can depend on the methods of making the electron transport layer. The average thickness of the electron transport layer can be measured using atomic force microscopy or scanning electron microscopy.

The hole transport layer can comprise any suitable material, such as those known in the art. In some examples, the hole transport layer can comprise Poly[bis(4-phenyl)(2,4,6-trimethylphenyl)amine (PTAA); 4,4'-Cyclohexylidenebis [N,N-bis(4-methylphenyl)benzenamine] (TAPC); N,N'-Bis (naphthalen-1-yl)-N,N'-bis(phenyl)-benzidine (NPB); N4, N4,N4',N4'-tetra([1,1'-biphenyl]-4-yl)-[1,1'-biphenyl]-4,4'-diamine; N4,N4-di(biphenyl-4-yl)-N4'-(naphthalen-1-yl)-N4'-phenyl-biphenyl-4,4'-diamine; 2,2'-Dimethyl-N4,N4, N4',N4'-tetram-tolylbiphenyl-4,4'-diamine (2,2'-HMTPD); 6,6'-(9',9'-Bis(6-((3-ethyloxetan-3-yl)methoxy)hexyl)-7,7'-diphenyl-9H,9'H-2,2'-bifluorene-9,9-diyl)bis(N,Ndiethylhexan-1-amine) (PFN-OX); N4,N4'-Bis(4-(6-((3-ethyloxetan-3-yl)methoxy)hexyl)phenyl)-N4,N4'-diphenylbiphenyl-4,4'-diamine (OTPD); N4,N4'-Di(naphthalen-1-yl)-N4,N4'-bis(4-vinylphenyl)biphenyl-4,4'-diamine (VNPB); N,N,N', N'-Tetra-(3-methylphenyl)-3,3'-dimethylbenzidine (HMTPD); 2,2',7,7'-Tetra(N,N-di-p-tolyl)amino-9,9-spirobifluorene (Spiro-TTB); N4,N4'-Bis(9,9-dimethyl-9H-fluoren-2-yl)-N4,N4'-diphenylbiphenyl-4,4'-diamine (BF-DPB); 2,2', 7,7'-Tetrakis[N-naphthalenyl(phenyl)-amino]-9,9-spirobifluorene (Spiro-2NPB); 2,2',7,7'-Tetrakis(N,N-diphenylamino)-2,7-diamino-9,9-spirobifluorene (Spiro-TAD); N,N'-Bis(naphthalen-1-yl)-N,N'-bis(phenyl)-2,2'-dimethylbenzidine (α-NPD); N,N'-Bis(naphthalen-1-yl)-N,N'-bis (phenyl)-2,7-diamino-9,9-dimethylfluorene (DMFL-NPB); N,N'-Bis(naphthalen-1-yl)-N,N'-bis(phenyl)-2,7-diamino-9, 9-spirobifluorene (Spiro-NPB); N,N'-Bis(3-methylphenyl)-N,N'-bis(phenyl)-benzidine (TPD); N,N'-Bis(naphthalen-2-yl)-N,N'-bis(phenyl)-benzidine (p-NPB); N,N'-Bis(3-methylphenyl)-N,N'-bis(phenyl)-2,7-diamino-9,9-dimethylfluorene (DMFL-TPD); N,N'-Bis(3-methylphenyl)-N,N'-bis (phenyl)-2,7-diamino-9,9-diphenylfluorene (DPFL-TPD); N,N'-Bis(naphthalen-1-yl)-N,N'-bis(phenyl)-2,7-diamino-9, 9-diphenylfluorene (DPFL-NPB); 9,9-Bis[4-(N,N-bis-naphthalen-2-yl-amino)phenyl]-9H-fluorene (NPAPF); 9,9-Bis [4-(N-naphthalen-1-yl-N-phenylamino)-phenyl]-9H-fluorene (NPBAPF); N,N'-Bis(phenanthren-9-yl)-N,N'-bis(phenyl)-benzidine (PAPB); N,N,N',N'-Tetra-naphthalen-2-yl-benzidine (β-TNB); N,N'-Di(naphthalenyl)-N,N'-di(naphthalen-2-yl)-benzidine (α,β-TNB); N,N,N',N'-Tetra-naphthalenyl-benzidine (α-TNB); N,N'-Di(naphthalen-2-yl)-N,N'-diphenylbenzene-1,4-diamine (β-NPP); $N^1,N^4$-Diphenyl-$N^1,N^4$-di-m-tolylbenzene-1,4-diamine (TTP); $N^2,N^2,N^6,N^6$-Tetraphenylnaphthalene-2,6-diamine (NDDP); Tris (4-(quinolin-8-yl)phenyl)amine (TQTPA); N4,N4'-Di(biphenyl-4-yl)-N4,N4'-diphenylbiphenyl-4,4'-diamine (TPD10); N2,N7-Di(naphthalen-1-yl)-9,9-dioctyl-N2,N7-diphenyl-9H-fluorene-2,7-Diamine (DOFL-NPB); N,N'-Bis(3-methylphenyl)-N,N'-bis(phenyl)-9,9-dioctyl-fluorene (DOFL-TPD); N4,N4'-Di(naphthalen-1-yl)-N4,N4'-bis(4-vinylphenyl)biphenyl-4,4'-diamine (NVPB); N4,N4'-Di(naphthalen-1-yl)-N4-(4-octylphenyl)-N4'-phenylbiphenyl-4,4'-Diamine (ONPB); N4,N4'-N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD); 4,4'-(Diphenylmethylene)bis(N,N-diphenylaniline) (TCBPA); N,N'-(4,4'-(Cyclohexane-1,1-diyl)bis(4,1-phenylene))bis (N-(4-(6-(2-ethyloxetan-2-yloxy)hexyl)phenyl)-3,4,5-trifluoroaniline) (X-F6-TAPC); Tris(phenylpyrazole)iridium (Ir (ppz)3); Tri(biphenyl-4-yl)amine (TBA); 2,2',7,7'-Octa(m-tolylamine)-9,9-spirobifluorene (Spiro-mTTB); Poly(9,9-bis(6-trimethyl ammoniumiodide)-hexylfluorene-2,7-diyl-alt(benzo[2,1,3]thiadiazol-4,7-diyl)) (PFNIBT); 4,4'-(Diphenylsilanediyl)bis(N,N-diphenylaniline) (TSBPA); 4,4'-(9H-fluoren-9-ylidene)bis[N,N-bis(4-methylphenyl)-benzenamine (BTAF); 9,10-Dihydro-9,9-dimethyl-10-(9-phenyl-9H-carbazol-3-yl)-acridine (PCZAC); poly(3,4-ethylenedioxythiophene) polystyrene sulfonate (PEDOT:PSS); $N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine (Spiro MeO-TAD); derivatives thereof; or combinations thereof. In some examples, the hole transport layer can comprise a metal oxide, for example an oxide of nickel, chromium, molybdenum, copper, tungsten, vanadium, or a mixture thereof. Specific examples of metal oxides that can be used as the hole transport materials include $NiO_x$, $CuO_x$, $CrO_x$, $MoO_x$, $WO_3$, $V_2O_5$, or a combination thereof.

In some examples, the hole transport layer can have an average thickness of 10 nm or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 550 nm or more, 600 nm or more, 650 nm or more, 700 nm or more, 750 nm or more, 800 nm or more, 850 nm or more, or 900 nm or more). In some examples, the hole transport layer can have an average thickness of 1000 nm or less (e.g., 950 nm or less, 900 nm or less, 850 nm or less, 800 nm or less, 750 nm or less, 700 nm or less, 650 nm or less, 600 nm or less, 550 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, or 20 nm or less). The average thickness of the hole transport layer can range from any of the minimum values described above to any of the maximum values described above. For example, the hole transport layer can have an average thickness from 10 nm to 1000 nm (e.g., from 10 nm to 500 nm, from 500 nm to 1000 nm, from 10 nm to 200 nm, from 200 nm to 400 nm, from 400 nm to 600 nm, from 600 nm to 800 nm, from 800 nm to 1000 nm, from 10 nm to 100 nm, from 100 nm to 1000 nm, from 20 nm to 1000 nm, from 10 nm to 900 nm, or from 20 nm to 900 nm). In some examples, the average thickness of the hole transport layer can depend on the methods of making the hole transport layer. The average thickness of the hole transport layer can be measured using atomic force microscopy or scanning electron microscopy.

The perovskite layer can, for example, have an average thickness of 100 nanometers (nm) or more (e.g., 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometers (microns, μm) or more, 2 μm or more, 3 μm or more, 4 μm or more, 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 mm or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 1 centimeter (cm), 1.25 cm or more, 1.5 cm or more, 1.75 cm or more, 2 cm or more, 2.25 cm or more, 2.5 cm or more, 3 cm or more, 3.5 cm or more, 4 cm or more, 4.5 cm or more, 5 cm or more, 6 cm or more, 7 cm or more, 8 cm or more, or 9 cm or more).

In some examples, the perovskite layer can have an average thickness of 10 centimeters (cm) or less (e.g., 9 cm or less, 8 cm or less, 7 cm or less, 6 cm or less, 5 cm or less, 4.5 cm or less, 4 cm or less, 3.5 cm or less, 3 cm or less, 2.5 cm or less, 2.25 cm or less, 2 cm or less, 1.75 cm or less, 1.5 cm or less, 1.25 cm or less, 1 cm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 μm or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 125 μm or less, 100 μm or less, 75 μm or less, 50 μm or less, 40 μm or less, 30 μm or less, 25 μm or less, 20 μm or less, 15 μm or less, 10 μm or less, 5 μm or less, 4 μm or less, 3 μm or less, 2 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, or 125 nm or less).

The average thickness of the perovskite layer can range from any of the minimum values described above to any of the maximum values described above. For example, the average thickness of the perovskite layer can be from 100 nm to 10 centimeters (cm) (e.g., from 100 nm to 10 μm, from 0.01 mm to 0.1 mm, from 0.1 mm to 1 mm, from 1 mm to 1 cm, from 1 cm to 10 cm, from 100 nm to 9 cm, from 200 nm to 10 cm, from 200 nm to 9 cm, from 0.1 mm to 9 cm, from 0.01 mm to 10 cm, or from 0.1 mm to 9 cm). The average thickness of the perovskite layer can be measured using atomic force microscopy, scanning electron microscopy, calipers, or a ruler. In some examples, the charge or electricity generating devices can comprise a plurality of perovskite layers stacked together, wherein the average thickness of each perovskite layer can independently be from 100 nm to 10 centimeters (cm).

In some examples, the perovskite layer comprises an n-type perovskite layer and a p-type perovskite layer; wherein the n-type perovskite layer comprises the perovskite doped with an n-type dopant or comprises a perovskite with n-type self-doping; wherein the p-type perovskite comprises the perovskite doped with a p-type dopant or comprises a perovskite with p-type self-doping; wherein the n-type perovskite layer is disposed between the electron transport layer and the p-type perovskite layer such that the n-type perovskite layer is in physical contact with the electron transport layer and the p-type perovskite layer; and wherein the p-type perovskite layer is disposed between the n-type perovskite layer and the hole transport layer such that the p-type perovskite layer is in physical contact with the n-type perovskite layer and the hole transport layer.

Also disclosed herein are charge or electricity generating devices comprising: a first electrode; an n-type perovskite layer; a p-type perovskite layer; and a second electrode; wherein the n-type perovskite layer is disposed between the first electrode and the p-type perovskite layer such that the n-type perovskite layer is in physical contact with the first electrode and the p-type perovskite layer; wherein the p-type perovskite layer is disposed between the n-type perovskite layer and the second electrode such that the p-type perovskite layer is in physical contact with the n-type perovskite layer and the second electrode; wherein the n-type perovskite layer comprises a perovskite doped with an n-type dopant or comprises a perovskite with n-type self-doping; wherein the p-type perovskite layer comprises the perovskite doped with a p-type dopant or comprises a perovskite with p-type self-doping; wherein the perovskite layer comprises a perovskite having a crystal lattice comprising a plurality of atoms, wherein at least a portion of the plurality of atoms within the crystal lattice of the perovskite comprise a radioactive isotope having a half-life of 100 days or more, wherein each radioactive isotope replaces one atom that is a non-radioactive counterpart of the radioactive isotope, such that the perovskite intrinsically comprises one or more radioactive isotopes in its crystal lattice (e.g., 2 or more, 3 or more, 4 or more, 5 or more, 6 or more, 7 or more, 8 or more, 9 or more, or 10 or more). The radioactive isotope can, for example, emit alpha particles, beta particles, gamma photons, or a combination thereof. The charge or electricity generating devices can, for example, generate charge or electricity upon decay of the one or more radioisotopes. For example, decay of the one or more radioactive isotopes can generate an electron-hole pair (e.g., one or more electron-hole pairs) in the perovskite, which can then be separated and transported out of the perovskite because of the built-in electric field due to the intrinsic p-n junction to generate charge.

The n-type perovskite layer can, for example, have an average thickness of 100 nanometers (nm) or more (e.g., 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometers (microns, μm) or more, 2 μm or more, 3 μm or more, 4 μm or more, 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 mm or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 1 centimeter (cm), 1.25 cm or more, 1.5 cm or more, 1.75 cm or more, 2 cm or more, 2.25 cm or more, 2.5 cm or more, 3 cm or more, 3.5 cm or more, 4 cm or more, 4.5 cm or more, 5 cm or more, 6 cm or more, 7 cm or more, 8 cm or more, or 9 cm or more).

In some examples, the n-type perovskite layer can have an average thickness of 10 centimeters (cm) or less (e.g., 9 cm or less, 8 cm or less, 7 cm or less, 6 cm or less, 5 cm or less, 4.5 cm or less, 4 cm or less, 3.5 cm or less, 3 cm or less, 2.5 cm or less, 2.25 cm or less, 2 cm or less, 1.75 cm or less, 1.5 cm or less, 1.25 cm or less, 1 cm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 μm or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 125 μm or less, 100 μm or less, 75 μm or less, 50 μm or less, 40 μm or less, 30 μm or less, 25 μm or less, 20 μm or less, 15 μm or less, 10 μm or less, 5 μm or less, 4 μm or less, 3 μm or less, 2 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, or 125 nm or less).

The average thickness of the n-type perovskite layer can range from any of the minimum values described above to any of the maximum values described above. For example, the average thickness of the n-type perovskite layer can be from 100 nm to 10 centimeters (cm) (e.g., from 100 nm to 10 μm, from 0.01 mm to 0.1 mm, from 0.1 mm to 1 mm, from 1 mm to 1 cm, from 1 cm to 10 cm, from 100 nm to 9 cm, from 200 nm to 10 cm, from 200 nm to 9 cm, from 0.1 mm to 9 cm, from 0.01 mm to 10 cm, or from 0.1 mm to 9 cm). The average thickness of the n-type perovskite layer can be measured using atomic force microscopy, scanning electron microscopy, calipers, or a ruler.

In some examples, the n-type dopant, or the equivalent doping concentration of the perovskite with n-type self-doping, is present in the n-type perovskite layer in a concentration of $10^8$ per cubic centimeter ($cm^3$) or more (e.g., $5 \times 10^8$ per $cm^3$ or more, $1 \times 10^9$ per $cm^3$ or more, $5 \times 10^9$ per $cm^3$ or more, $1 \times 10^{10}$ per $cm^3$ or more, $5 \times 10^{10}$ per $cm^3$ or more, $1 \times 10^{11}$ per $cm^3$ or more, $5 \times 10^{11}$ per $cm^3$ or more, $1 \times 10^{12}$ per $cm^3$ or more, $5 \times 10^{12}$ per $cm^3$ or more, $1 \times 10^{13}$ per $cm^3$ or more, $5 \times 10^{13}$ per $cm^3$ or more, $1 \times 10^{14}$ per $cm^3$ or more, $5 \times 10^{14}$ per $cm^3$ or more, $1 \times 10^{15}$ per $cm^3$ or more, $5 \times 10^{15}$ per $cm^3$ or more, $1 \times 10^{16}$ per $cm^3$ or more, $5 \times 10^{16}$ per $cm^3$ or more, $1 \times 10^{17}$ per $cm^3$ or more, or $5 \times 10^{17}$ per $cm^3$ or more). In some examples, the n-type dopant, or the equivalent doping concentration of the perovskite with n-type self-doping, is present in the n-type perovskite layer in a concentration of $10^{18}$ per $cm^3$ or less (e.g., $1 \times 10^{18}$ per $cm^3$ or less, $5 \times 10^{17}$ per $cm^3$ or less, $1 \times 10^{17}$ per $cm^3$ or less, $5 \times 10^{16}$ per $cm^3$ or less, $1 \times 10^{16}$ per $cm^3$ or less, $5 \times 10^{15}$ per $cm^3$ or less, $1 \times 10^{15}$ per $cm^3$ or less, $5 \times 10^{14}$ per $cm^3$ or less, $1 \times 10^{14}$ per $cm^3$ or less, $5 \times 10^{13}$ per $cm^3$ or less, $1 \times 10^{13}$ per $cm^3$ or less, $5 \times 10^{12}$ per $cm^3$ or less, $1 \times 10^{12}$ per $cm^3$ or less, $5 \times 10^{11}$ per $cm^3$ or less, $1 \times 10^{11}$ per $cm^3$ or less, $5 \times 10^{10}$ per $cm^3$ or less, $1 \times 10^{10}$ per $cm^3$ or less, $5 \times 10^9$ per $cm^3$ or less, $1 \times 10^9$ per $cm^3$ or less, or $5 \times 10^8$ per $cm^3$ or less). The concentration of the n-type dopant, or the equivalent doping concentration of the perovskite with n-type self-doping, in the n-type perovskite layer can range from any of the minimum values described above to any of the maximum values described above. For example, the n-type dopant, or the equivalent doping concentration of the perovskite with n-type self-doping, can be present in the n-type perovskite layer in a concentration of from $10^8$ per cm$^3$ to $10^{18}$ per cm$^3$ (e.g., from $10^8$ per cm$^3$ to $10^{13}$ per cm$^3$, from $10^{13}$ per cm$^3$ to $10^{18}$ per cm$^3$, from $10^8$ per cm$^3$ to $10^{10}$ per cm$^3$, from $10^{10}$ per cm$^3$ to $10^{12}$ per cm$^3$, from $10^{12}$ per cm$^3$ to $10^{14}$ per cm$^3$, from $10^{14}$ per cm$^3$ to $10^{16}$ per cm$^3$, from $10^{16}$ per cm$^3$ to $10^{18}$ per cm$^3$, from $10^9$ per cm$^3$ to $10^{18}$ per cm$^3$, from $10^8$ per cm$^3$ to $10^{17}$ per cm$^3$, or from $10^9$ per cm$^3$ to $10^{17}$ per cm$^3$).

The n-type dopant can be any compound, element, or ion behaving as an electron donor or can be any defect, for example a point defect, grain boundary, etc., that behaves as an electron donor in the case of a perovskite showing n-type self-doping. In some examples, the n-type dopant comprises Cl, Sb, and combinations thereof. In some examples, the n-type perovskite comprises CsPbCl$_3$, CH$_3$NH$_3$PbCl$_3$ or any other perovskite where electrons are a major charge carrier.

The p-type perovskite layer can, for example, have an average thickness of 100 nanometers (nm) or more (e.g., 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometers (microns, µm) or more, 2 µm or more, 3 µm or more, 4 µm or more, 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 mm or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 1 centimeter (cm), 1.25 cm or more, 1.5 cm or more, 1.75 cm or more, 2 cm or more, 2.25 cm or more, 2.5 cm or more, 3 cm or more, 3.5 cm or more, 4 cm or more, 4.5 cm or more, 5 cm or more, 6 cm or more, 7 cm or more, 8 cm or more, or 9 cm or more).

In some examples, the p-type perovskite layer can have an average thickness of 10 centimeters (cm) or less (e.g., 9 cm or less, 8 cm or less, 7 cm or less, 6 cm or less, 5 cm or less, 4.5 cm or less, 4 cm or less, 3.5 cm or less, 3 cm or less, 2.5 cm or less, 2.25 cm or less, 2 cm or less, 1.75 cm or less, 1.5 cm or less, 1.25 cm or less, 1 cm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 µm or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 125 µm or less, 100 µm or less, 75 µm or less, 50 µm or less, 40 µm or less, 30 µm or less, 25 µm or less, 20 µm or less, 15 µm or less, 10 µm or less, 5 µm or less, 4 µm or less, 3 µm or less, 2 µm or less, 1 µm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, or 125 nm or less).

The average thickness of the p-type perovskite layer can range from any of the minimum values described above to any of the maximum values described above. For example, the average thickness of the p-type perovskite layer can be from 100 nm to 10 centimeters (cm) (e.g., from 100 nm to 10 µm, from 0.01 mm to 0.1 mm, from 0.1 mm to 1 mm, from 1 mm to 1 cm, from 1 cm to 10 cm, from 100 nm to 9 cm, from 200 nm to 10 cm, from 200 nm to 9 cm, from 0.1 mm to 9 cm, from 0.01 mm to 10 cm, or from 0.1 mm to 9 cm). The average thickness of the p-type perovskite layer can be measured using atomic force microscopy, scanning electron microscopy, calipers, or a ruler.

In some examples, the p-type dopant, or the equivalent doping concentration of the perovskite with p-type self-doping, is present in the p-type perovskite layer in a concentration of $10^8$ per cubic centimeter (cm$^3$) or more (e.g., $5\times10^8$ per cm$^3$ or more, $1\times10^9$ per cm$^3$ or more, $5\times10^9$ per cm$^3$ or more, $1\times10^{10}$ per cm$^3$ or more, $5\times10^{10}$ per cm$^3$ or more, $1\times10^{11}$ per cm$^3$ or more, $5\times10^{11}$ per cm$^3$ or more, $1\times10^{12}$ per cm$^3$ or more, $5\times10^{12}$ per cm$^3$ or more, $1\times10^{13}$ per cm$^3$ or more, $5\times10^{13}$ per cm$^3$ or more, $1\times10^{14}$ per cm$^3$ or more, $5\times10^{14}$ per cm$^3$ or more, $1\times10^{15}$ per cm$^3$ or more, $5\times10^{15}$ per cm$^3$ or more, $1\times10^{16}$ per cm$^3$ or more, $5\times10^{16}$ per cm$^3$ or more, $1\times10^{17}$ per cm$^3$ or more, or $5\times10^{17}$ per cm$^3$ or more). In some examples, the p-type dopant, or the equivalent doping concentration of the perovskite with p-type self-doping, is present in the p-type perovskite layer in a concentration of $10^{18}$ per cm$^3$ or less (e.g., $1\times10^{18}$ per cm$^3$ or less, $5\times10^{17}$ per cm$^3$ or less, $1\times10^{17}$ per cm$^3$ or less, $5\times10^{16}$ per cm$^3$ or less, $1\times10^{16}$ per cm$^3$ or less, $5\times10^{15}$ per cm$^3$ or less, $1\times10^{15}$ per cm$^3$ or less, $5\times10^{14}$ per cm$^3$ or less, $1\times10^{14}$ per cm$^3$ or less, $5\times10^{13}$ per cm$^3$ or less, $1\times10^{13}$ per cm$^3$ or less, $5\times10^{12}$ per cm$^3$ or less, $1\times10^{12}$ per cm$^3$ or less, $5\times10^{11}$ per cm$^3$ or less, $1\times10^{11}$ per cm$^3$ or less, $5\times10^{10}$ per cm$^3$ or less, $1\times10^{10}$ per cm$^3$ or less, $5\times10^9$ per cm$^3$ or less, $1\times10^9$ per cm$^3$ or less, or $5\times10^8$ per cm$^3$ or less). The concentration of the p-type dopant, or the equivalent doping concentration of the perovskite with p-type self-doping, in the p-type perovskite layer can range from any of the minimum values described above to any of the maximum values described above. For example, the p-type dopant, or the equivalent doping concentration of the perovskite with p-type self-doping, can be present in the p-type perovskite layer in a concentration of from $10^8$ per cm$^3$ to $10^{18}$ per cm$^3$ (e.g., from $10^8$ per cm$^3$ to $10^{13}$ per cm$^3$, from $10^{13}$ per cm$^3$ to $10^{18}$ per cm$^3$, from $10^8$ per cm$^3$ to $10^{10}$ per cm$^3$, from $10^{10}$ per cm$^3$ to $10^{12}$ per cm$^3$, from $10^{12}$ per cm$^3$ to $10^{14}$ per cm$^3$, from $10^{14}$ per cm$^3$ to $10^{16}$ per cm$^3$, from $10^{16}$ per cm$^3$ to $10^{18}$ per cm$^3$, from $10^9$ per cm$^3$ to $10^{18}$ per cm$^3$, from $10^8$ per cm$^3$ to $10^{17}$ per cm$^3$, or from $10^9$ per cm$^3$ to $10^{17}$ per cm$^3$).

The p-type dopant can comprise any compound, element, or ion behaving as an acceptor or can be any defect, for example a point defect, grain boundary, etc., that behaves as an electron acceptor in the case of a perovskite showing p-type self-doping. In some examples, the p-type dopant comprises Br, I, or combinations thereof. In some examples, the p-type perovskite comprises CsPbBr$_3$, CH$_3$NH$_3$PbBr$_3$ or any other perovskite where holes are a major charge carrier.

The first electrode and/or the second electrode can comprise a metal, a transparent conducting oxide, a conducting polymer, a carbon material, or a combination thereof.

In some examples, the first electrode, the second electrode, or a combination thereof comprise(s) a metal. The metal can, for example, comprise a metal selected from the group consisting of Al, Zr, Bi, Ti, Ni, Cu, Ga, In, Ag, Ir, Pt, Au, Cr, Mo, Pd, W, and combinations thereof.

Examples of carbon materials include, but are not limited to, graphitic carbon and graphites, including pyrolytic graphite (e.g., highly ordered pyrolytic graphite (HOPG)) and isotropic graphite, amorphous carbon, carbon black, single- or multi-walled carbon nanotubes, buckminsterfullerene ($C_{60}$), graphene, glassy carbon, diamond-like carbon (DLC) or doped DLC, such as boron-doped diamond, pyrolyzed photoresist films, and others known in the art. In some examples, the first electrode, the second electrode, or a combination thereof comprise(s) a graphene-based transparent conducting electrode.

In some examples, the first electrode, the second electrode, or a combination thereof comprise(s) a transparent conducting oxide or a graphene-based transparent conducting electrode. Examples of transparent conducting oxides include, but are not limited to, indium doped tin oxide (ITO), fluorine doped tin oxide (FTO), aluminum zinc oxide (AZO), tin doped indium oxide, and combinations thereof.

In some examples, the first electrode, the second electrode, or a combination thereof can comprise a metal oxide. Examples of metal oxides include simple metal oxides (e.g., with a single metal element) and mixed metal oxides (e.g., with different metal elements). The metal oxide can, for example, comprise a metal selected from the group consisting of Cd, Cr, Cu, Ga, In, Ni, Sn, Ti, W, Zn, and combinations thereof. In some examples, the first electrode, the second electrode, or a combination thereof can comprise CdO, $CdIn_2O_4$, $Cd_2SnO_4$, $Cr_2O_3$, $CuCrO_2$, $CuO_2$, $Ga_2O_3$, $In_2O_3$, NiO, $SnO_2$, $TiO_2$, $ZnGa_2O_4$, ZnO, InZnO, InGaZnO, InGaO, ZnSnO, $Zn_2SnO_4$, CdSnO, $WO_3$, or combinations thereof.

In some examples, the first electrode, the second electrode, or a combination thereof can comprise a conducting polymer such as polyacetylene, polyalanine, poly(3,4-ethylenedioxythiophene) polystyrene sulfonate, or combinations thereof.

In some examples, the first electrode, the second electrode, or a combination thereof can further comprise a radioactive isotope, such as a radioactive isotope having a half-life of 100 days or more. For example, the first electrode, the second electrode, or a combination thereof can further comprise a radioactive isotope selected from the group consisting of $^{108m}Ag$, $^{110m2}Ag$, $^{26}Al$, $^{195}Au$, $^{207}Bi$, $^{208}Bi$, $^{209}Bi$, $^{210m}Bi$, $^{10}Be$, $^{14}C$, $^{41}Ca$, $^{45}Ca$, $^{109}Cd$, $^{113}Cd$, $^{36}Cl$, $^{57}Co$, $^{60}Co$, $^{134}Cs$, $^{135}Cs$, $^{137}Cs$, $^{150}Eu$, $^{152}Eu$, $^{154}Eu$, $^{155}Eu$, $^{55}Fe$, $^{60}Fe$, $^{3}H$, $^{129}I$, $^{115}In$, $^{40}K$, $^{53}Mn$, $^{93}Mo$, $^{22}Na$, $^{91}Nb$, $^{92}Nb$, $^{93m}Nb$, $^{94}Nb$, $^{59}Ni$, $^{63}Ni$, $^{202}Pb$, $^{205}Pb$, $^{210}Pb$, $^{107}Pd$, $^{87}Rb$, $^{186m}Re$, $^{187}Re$, $^{101}Rh$, $^{106}Ru$, $^{32}Si$, $^{113}Sn$, $^{123}Sn$, $^{126}Sn$, $^{90}Sr$, $^{44}Ti$, $^{49}V$, $^{65}Zn$, $^{93}Zr$, $^{96}Zr$, and combinations thereof. In some examples, the first electrode, the second electrode, or a combination thereof can further comprise a radioactive isotope selected from the group consisting of $^{108m}Ag$, $^{110m2}Ag$, $^{26}Al$, $^{195}Au$, $^{14}C$, $^{109}Cd$, $^{113}Cd$, $^{3}H$, $^{115}In$, $^{93}Mo$, $^{59}Ni$, $^{63}Ni$, $^{107}Pd$, $^{113}Sn$, $^{123}Sn$, $^{126}Sn$, $^{44}Ti$, $^{65}Zn$, and combinations thereof. For example, the first electrode, the second electrode, or a combination thereof can comprise $^{63}Ni$.

In some examples, the first electrode comprises a metal and the second electrode comprises a transparent conducting oxide. In some examples, the first electrode comprises a metal and the second electrode comprises a metal. In some examples, the first electrode comprises a transparent conducting oxide and the second electrode comprises a metal.

In some examples, the first electrode can have an average thickness of 10 nm or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 550 nm or more, 600 nm or more, 650 nm or more, 700 nm or more, 750 nm or more, 800 nm or more, 850 nm or more, or 900 nm or more). In some examples, the first electrode can have an average thickness of 1000 nm or less (e.g., 950 nm or less, 900 nm or less, 850 nm or less, 800 nm or less, 750 nm or less, 700 nm or less, 650 nm or less, 600 nm or less, 550 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, or 20 nm or less). The average thickness of the first electrode can range from any of the minimum values described above to any of the maximum values described above. For example, the first electrode can have an average thickness from 10 nm to 1000 nm (e.g., from 10 nm to 500 nm, from 500 nm to 1000 nm, from 10 nm to 200 nm, from 200 nm to 400 nm, from 400 nm to 600 nm, from 600 nm to 800 nm, from 800 nm to 1000 nm, from 10 nm to 100 nm, from 100 nm to 1000 nm, from 20 nm to 1000 nm, from 10 nm to 900 nm, or from 20 nm to 900 nm). The average thickness of the first electrode can be measured using atomic force microscopy or scanning electron microscopy.

In some examples, the second electrode can have an average thickness of 10 nm or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 550 nm or more, 600 nm or more, 650 nm or more, 700 nm or more, 750 nm or more, 800 nm or more, 850 nm or more, or 900 nm or more). In some examples, the second electrode can have an average thickness of 1000 nm or less (e.g., 950 nm or less, 900 nm or less, 850 nm or less, 800 nm or less, 750 nm or less, 700 nm or less, 650 nm or less, 600 nm or less, 550 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, or 20 nm or less). The average thickness of the second electrode can range from any of the minimum values described above to any of the maximum values described above. For example, the second electrode can have an average thickness from 10 nm to 1000 nm (e.g., from 10 nm to 500 nm, from 500 nm to 1000 nm, from 10 nm to 200 nm, from 200 nm to 400 nm, from 400 nm to 600 nm, from 600 nm to 800 nm, from 800 nm to 1000 nm, from 10 nm to 100 nm, from 100 nm to 1000 nm, from 20 nm to 1000 nm, from 10 nm to 900 nm, or from 20 nm to 900 nm). The average thickness of the second electrode can be measured using atomic force microscopy or scanning electron microscopy.

Also disclosed herein are charge or electricity generating devices comprising: a self-illuminating perovskite scintillator layer and one or more photovoltaic devices (e.g., 2 or more, 3 or more, 4 or more, 5 or more, 6 or more, 7 or more, 8 or more, 9 or more, or 10 or more); wherein the self-illuminating perovskite scintillator layer is in radiative contact with the one or more photovoltaic devices; and wherein the self-illuminating perovskite scintillator layer comprises a perovskite having a crystal lattice comprising a plurality of atoms, wherein at least a portion of the plurality of atoms within the crystal lattice of the perovskite comprise a radioactive isotope having a half-life of 100 days or more, wherein each radioactive isotope replaces one atom that is a non-radioactive counterpart of the radioactive isotope, such that the perovskite intrinsically comprises one or more radioactive isotopes in its crystal lattice (e.g., 2 or more 3 or more, 4 or more, 5 or more, 6 or more, 7 or more, 8 or more, 9 or more, or 10 or more). As used herein, radiative contact means that the perovskite scintillation layer is disposed relative to the one or more photovoltaic devices such that a photon emitted from the perovskite scintillation layer can reach and penetrate the one or more photovoltaic devices, to thereby generate charge. In some examples, the self-illuminating perovskite scintillator layer is optically coupled to the one or more photovoltaic devices. The radioactive isotope can, for example, emit alpha particles, beta particles, gamma photons, or a combination thereof. The charge or electricity generating devices can, for example, generate charge or electricity upon decay of the one or more radioisotopes. For example, decay of the one or more radioactive isotopes can generate an electron-hole pair in the perovskite, which can then recombine inside the perovskite to emit photons, and the photons emitted from the self-illuminating perovskite scintillator layer can be collected by the one or more photovoltaic devices, to thereby generate charge. The one or more photovoltaic devices can, for example, comprise one or more photovoltaic cells.

In some examples, the device can comprise one photovoltaic device. In some examples, the device can comprise one photovoltaic device and the photovoltaic device can be disposed opposite and spaced apart from the self-illuminating perovskite scintillator layer. In some examples, the device comprises two or more photovoltaic devices (e.g., 3 or more, 4 or more, 5 or more, 6 or more, 7 or more, 8 or more, 9 or more, or 10 or more). In some examples, the device comprises two photovoltaic devices. In some examples, the device comprises two photovoltaic devices and the self-illuminating perovskite scintillator layer can be disposed between and spaced apart from the two photovoltaic devices.

The self-illuminating perovskite scintillator layer can, for example, have an average thickness of 0.01 millimeters (mm) or more (e.g., 0.05 mm or more, 0.1 mm or more, 0.15 mm or more, 0.2 mm or more, 0.25 mm or more, 0.3 mm or more, 0.35 mm or more, 0.4 mm or more, 0.45 mm or more, 0.5 mm or more, 0.6 mm or more, 0.7 mm or more, 0.8 mm or more, 0.9 mm or more, 1 mm or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 1 centimeter (cm), 1.25 cm or more, 1.5 cm or more, 1.75 cm or more, 2 cm or more, 2.25 cm or more, 2.5 cm or more, 3 cm or more, 3.5 cm or more, 4 cm or more, 4.5 cm or more, 5 cm or more, 6 cm or more, 7 cm or more, 8 cm or more, or 9 cm or more). In some examples, the self-illuminating perovskite scintillator layer can have an average thickness of 10 centimeters (cm) or less (e.g., 9 cm or less, 8 cm or less, 7 cm or less, 6 cm or less, 5 cm or less, 4.5 cm or less, 4 cm or less, 3.5 cm or less, 3 cm or less, 2.5 cm or less, 2.25 cm or less, 2 cm or less, 1.75 cm or less, 1.5 cm or less, 1.25 cm or less, 1 cm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 0.9 mm or less, 0.8 mm or less, 0.7 mm or less, 0.6 mm or less, 0.5 mm or less, 0.45 mm or less, 0.4 mm or less, 0.35 mm or less, 0.3 mm or less, 0.25 mm or less, 0.2 mm or less, 0.15 mm or less, 0.1 mm or less, or 0.05 mm or less). The average thickness of the self-illuminating perovskite scintillator layer can range from any of the minimum values described above to any of the maximum values described above. For example, the average thickness of the self-illuminating perovskite scintillator layer can be from 0.01 millimeters (mm) to 10 centimeters (cm) (e.g., from 0.01 mm to 0.1 mm, from 0.1 mm to 1 mm, from 1 mm to 1 cm, from 1 cm to 10 cm, from 0.1 mm to 9 cm, from 0.01 mm to 10 cm, or from 0.1 mm to 9 cm). The average thickness of the self-illuminating perovskite scintillator layer can be measured using atomic force microscopy, scanning electron microscopy, calipers, or a ruler.

The perovskite layer or the self-illuminating perovskite scintillator layer of any of the devices described herein comprises a perovskite having a crystal lattice comprising a plurality of atoms, wherein at least a portion of the plurality of atoms within the crystal lattice of the perovskite comprise a radioactive isotope having a half-life of 100 days or more, wherein each radioactive isotope replaces one atom that is a non-radioactive counterpart of the radioactive isotope, such that the perovskite intrinsically comprises one or more radioactive isotopes in its crystal lattice (e.g., 2 or more 3 or more, 4 or more, 5 or more, 6 or more, 7 or more, 8 or more, 9 or more, or 10 or more). Examples of radioactive isotopes having a half-life of 100 days or more include, but are not limited to, $^{108m}$Ag, $^{110m2}$Ag, $^{26}$Al, $^{195}$Au, $^{207}$Bi, $^{208}$Bi, $^{209}$Bi, $^{210m}$Bi, $^{10}$Be, $^{14}$C, $^{41}$Ca, $^{45}$Ca, $^{109}$Cd, $^{113}$Cd, $^{36}$Cl, $^{57}$Co, $^{60}$Co, $^{134}$Cs, $^{135}$Cs, $^{137}$Cs, $^{150}$Eu, $^{152}$Eu, $^{154}$Eu, $^{155}$Eu, $^{55}$Fe, $^{60}$Fe, $^{152}$Gd, $^{3}$H, $^{129}$I, $^{115}$In, $^{40}$K, $^{53}$Mn, $^{93}$Mo, $^{22}$Na, $^{91}$Nb, $^{92}$Nb, $^{93m}$Nb, $^{94}$Nb, $^{59}$Ni, $^{63}$Ni, $^{202}$Pb, $^{205}$Pb, $^{210}$Pb, $^{107}$Pd, $^{87}$Rb, $^{186m}$Re, $^{187}$Re, $^{101}$Rh, $^{106}$Ru, $^{32}$Si, $^{113}$Sn, $^{123}$Sn, $^{126}$Sn, $^{90}$Sr, $^{44}$Ti, $^{49}$V, $^{65}$Zn, $^{93}$Zr, $^{96}$Zr, and combinations thereof. The radioactive isotope can, for example, emit alpha particles, beta particles, gamma photons, or a combination thereof.

In some examples, the perovskite can comprise a material having the general structural formula $QZX_3$, wherein Q and Z are cations of different sizes and X is an anion. The skilled person will also appreciate a perovskite material could be represented by the formula $[Q][Z][X]_3$, wherein Q is at least one cation, Z is at least one cation and X is at least one anion.

In some examples, the perovskite comprises a material defined by the formula $[Q][Z][X]_3$, wherein: Q is at least one cation comprising an organic group, an inorganic group, or a combination thereof; Z is at least one cation comprising a metal, a metalloid, or a combination thereof; and X is at least one anion comprising a halide; with the proviso that at least a portion of Q, Z, X, or a combination thereof comprises a radioactive isotope having a half-life of 100 days or more. In some examples, Q comprises methylammonium $CH_3NH_3$ (MA), formamidinium $CH(NH_2)_2$ (FA), n-butylammonium, tetra-butylammonium $C_4H_9NH_3$ (BA), Cs, or a combination thereof. In some examples, Z comprises a transition metal, such as Pb, Sn, Cs, Bi, Ag, or a combination thereof. In some examples, X is I, Cl, Br, or a combination thereof. In some examples, Q comprises methylammonium $CH_3NH_3$ (MA), formamidinium $CH(NH_2)_2$ (FA), n-butylammonium, tetra-butylammonium $C_4H_9NH_3$ (BA), Cs, or a combination thereof; Z comprises a transition metal, such as Pb, Sn, Cs, Bi, Ag, or a combination thereof; and X is I, Cl, Br, or a combination thereof.

In some examples, the perovskite comprises $[MA_aFA_b\text{-}BA_cCs_d][Pb_eSn_fCs_g][In_hCl_iBr_j]$, wherein a-g are independently from 0 to 1; h-j are independently 0-3; the sum of a-d is 1; the sum of e-g is 1; and the sum of h-j is 3; with the proviso that: when d is not 0 then g is 0, and when g is not 0 then d is 0.

For example, a-g can independently be 0 or more (e.g., 0.1 or more, 0.2 or more, 0.3 or more, 0.4 or more, 0.5 or more, 0.6 or more, 0.7 or more, 0.8 or more, or 0.9 or more). In some examples, a-g can independently be 1 or less (e.g., 0.9 or less, 0.8 or less, 0.7 or less, 0.6 or less, 0.5 or less, 0.4 or less, 0.3 or less, 0.2 or less, or 0.1 or less). The values of a-g can independently range from any of the minimum values described above to any of the maximum values described above. For example, a-g can independently be from 0 to 1 (e.g., from 0 to 0.5, from 0.5 to 1, from 0 to 0.2, from 0.2 to 0.4, from 0.4 to 0.6, from 0.6 to 0.8, from 0.8 to 1, from 0 to 0.9, from 0.1 to 1, or from 0.1 to 0.9).

For example, h-j can independently be 0 or more (e.g., 0.1 or more, 0.2 or more, 0.3 or more, 0.4 or more, 0.5 or more, 0.6 or more, 0.7 or more, 0.8 or more, 0.9 or more, 1 or more, 1.1 or more, 1.2 or more, 1.3 or more, 1.4 or more, 1.5 or more, 1.6 or more, 1.7 or more, 1.8 or more, 1.9 or more, 2 or more, 2.1 or more, 2.2 or more, 2.3 or more, 2.4 or more, 2.5 or more, 2.6 or more, 2.7 or more, 2.8 or more, or 2.9 or more). In some examples, h-j can independently be 3 or less (e.g., 2.9 or less, 2.8 or less, 2.7 or less, 2.6 or less, 2.5 or less, 2.4 or less, 2.3 or less, 2.2 or less, 2.1 or less, 2 or less, 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less). The values of h-j can independently range from any of the minimum values described above to any of the maximum values described above. For example, h-j can independently be from 0 to 3 (e.g., from 0 to 1.5, from 1.5 to 3, from 0 to 1, from 1 to 2, from 2 to 3, from 0.1 to 3, from 0 to 2.9, or from 0.1 to 2.9).

In some examples, the perovskite can comprise $MAPbI_xBr_{3-x}$, $MAPbI_xCl_{3-x}$, $MAPbBr_xCl_{1-x}$, $FAPbI_xBr_{3-x}$, $FAPbI_xCl_{3-x}$, $FAPbBr_xCl_{3-x}$, $BAPbI_xBr_{3-x}$, $BAPbI_xCl_{3-x}$, $BAPbBr_xCl_{3-x}$, $CsPbI_xBr_{3-x}$, $CsPbI_xCl_{3-x}$, $CsPbBr_xCl_{1-x}$, $MASnI_xBr_{3-x}$, $MASnI_xCl_{3-x}$, $MaSnBr_xCl_{1-x}$, $FASnI_xBr_{3-x}$, $FASnI_xCl_{3-x}$, $FASnBr_xCl_{3-x}$, $BASnI_xBr_{3-x}$, $BASnI_xCl_{3-x}$, $BASnBr_xCl_{3-x}$, or a combination thereof, wherein x is from 0 to 3. In some examples, the perovskite can comprise $MAPbI_3$, $MAPbBr_3$, $MAPbCl_3$, $MAPbBr_{2.94}Cl_{0.06}$, $MAPbBr_{2.85}Cl_{0.15}$, $FAPbI_3$, $FAPbBr_3$, $BAPbI_3$, $BAPbBr_3$, $MASnI_3$, $MASnBr_3$, $FASnI_3$, $FASnBr_3$, $BASnI_3$, $BASnBr_3$, $CsPbBr_3$, $FA_{0.97}MA_{0.03}PbBr_{2.91}Cl_{0.09}$, $Cs_{0.2}MA_{0.8}PbBr_{2.98}Cl_{0.02}$, or a combination thereof.

In some examples, the radioactive isotope is $^{14}C$, $^{36}Cl$, $^{134}Cs$, $^{135}Cs$, $^{137}Cs$, $^{3}H$, $^{129}I$, $^{202}Pb$, $^{205}Pb$, $^{210}Pb$, $^{113}Sn$, $^{123}Sn$, $^{126}Sn$, or a combination thereof. In some examples, the radioactive isotope is $^{36}Cl$, $^{134}Cs$, $^{135}Cs$, $^{3}H$, $^{129}I$, $^{202}Pb$, $^{205}Pb$, $^{210}Pb$, $^{113}Sn$, $^{123}Sn$, $^{126}Sn$, or a combination thereof. In some examples, the radioactive isotope is $^{3}H$.

In some examples, the perovskite can comprise $MAPbI_xBr_{3-x}$, $MAPbI_xCl_{3-x}$, $MAPbBr_xCl_{1-x}$, $FAPbI_xBr_{3-x}$, $FAPbI_xCl_{3-x}$, $FAPbBr_xCl_{3-x}$, $BAPbI_xBr_{3-x}$, $BAPbI_xCl_{3-x}$, $BAPbBr_xCl_{3-x}$, $CsPbI_xBr_{3-x}$, $CsPbI_xCl_{3-x}$, $CsPbBr_xCl_{1-x}$, $MASnI_xBr_{3-x}$, $MASnI_xCl_{3-x}$, $MaSnBr_xCl_{1-x}$, $FASnI_xBr_{3-x}$, $FASnI_xCl_{3-x}$, $FASnBr_xCl_{3-x}$, $BASnI_xBr_{3-x}$, $BASnI_xCl_{3-x}$, $BASnBr_xCl_{3-x}$, or a combination thereof, wherein x is from 0 to 3, and the radioactive isotope is $^{14}C$, $^{36}Cl$, $^{134}Cs$, $^{135}Cs$, $^{137}Cs$, $^{3}H$, $^{129}I$, $^{202}Pb$, $^{205}Pb$, $^{210}Pb$, $^{113}Sn$, $^{123}Sn$, $^{126}Sn$, or a combination thereof. In some examples, the perovskite can comprise $MAPbI_xBr_{3-x}$, $MAPbI_xCl_{3-x}$, $MAPbBr_xCl_{1-x}$, $FAPbI_xBr_{3-x}$, $FAPbI_xCl_{3-x}$, $FAPbBr_xCl_{3-x}$, $BAPbI_xBr_{3-x}$, $BAPbI_xCl_{3-x}$, $BAPbBr_xCl_{3-x}$, $CsPbI_xBr_{3-x}$ $CsPbI_xCl_{3-x}$, $CsPbBr_xCl_{1-x}$, $MASnI_xBr_{3-x}$, $MASnI_xCl_{3-x}$, $MaSnBr_xCl_{1-x}$, $FASnI_xBr_{3-x}$, $FASnI_xCl_{3-x}$, $FASnBr_xCl_{3-x}$, $BASnI_xBr_{3-x}$, $BASnI_xCl_{3-x}$, $BASnBr_xCl_{3-x}$, or a combination thereof, wherein x is from 0 to 3, and the radioactive isotope is $^{36}Cl$, $^{134}Cs$, $^{135}Cs$, $^{3}H$, $^{129}I$, $^{202}Pb$, $^{205}Pb$, $^{210}Pb$, $^{1123}Sn$, $^{123}Sn$, $^{126}Sn$, or a combination thereof. In some examples, the perovskite can comprise $MAPbI_xBr_{3-x}$ $MAPbI_xCl_{3-x}$, $MAPbBr_xCl_{1-x}$, $FAPbI_xBr_{3-x}$, $FAPbI_xCl_{3-x}$, $FAPbBr_xCl_{3-x}$, $BAPbI_xBr_{3-x}$, $BAPbI_xCl_{3-x}$, $BAPbBr_xCl_{3-x}$, $MASnI_xBr_{3-x}$ $MASnI_xC_{3-x}$, $MaSnBr_xCl_{1-x}$, $FASnI_xBr_{3-x}$, $FASnI_xCl_{3-x}$, $FASnBr_xCl_{3-x}$, $BASnI_xBr_{3-x}$, $BASnI_xCl_{3-x}$, $BASnBr_xCl_{3-x}$, or a combination thereof, wherein x is from 0 to 3, and the radioactive isotope is $^{3}H$.

In some examples, the perovskite can comprise $MAPbI_3$, $MAPbBr_3$, $MAPbCl_3$, $MAPbBr_{2.94}Cl_{0.06}$, $MAPbBr_{2.85}Cl_{0.15}$, $FAPbI_3$, $FAPbBr_3$, $BAPbI_3$, $BAPbBr_3$, $MASnI_3$, $MASnBr_3$, $FASnI_3$, $FASnBr_3$, $BASnI_3$, $BASnBr_3$, $CsPbBr_3$, $FA_{0.97}MA_{0.03}PbBr_{2.91}Cl_{0.09}$, $Cs_{0.2}MA_{0.8}PbBr_{2.98}Cl_{0.02}$, or a combination thereof, and the radioactive isotope is $^{14}C$, $^{36}Cl$, $^{134}Cs$, $^{135}Cs$, $^{137}Cs$, $^{3}H$, $^{129}I$, $^{202}Pb$, $^{205}Pb$, $^{210}Pb$, $^{113}Sn$, $^{123}Sn$, $^{126}Sn$, or a combination thereof. In some examples, the perovskite can comprise $MAPbI_3$, $MAPbBr_3$, $MAPbCl_3$, $MAPbBr_{2.94}Cl_{0.06}$, $MAPbBr_{2.85}Cl_{0.15}$, $FAPbI_3$, $FAPbBr_3$, $BAPbI_3$, $BAPbBr_3$, $MASnI_3$, $MASnBr_3$, $FASnI_3$, $FASnBr_3$, $BASnI_3$, $BASnBr_3$, $CsPbBr_3$, $FA_{0.97}MA_{0.03}PbBr_{2.91}Cl_{0.09}$, $Cs_{0.2}MA_{0.8}PbBr_{2.98}Cl_{0.02}$, or a combination thereof, and the radioactive isotope is $^{36}Cl$, $^{134}Cs$, $^{135}Cs$, $^{3}H$, $^{129}I$, $^{202}Pb$, $^{205}Pb$, $^{210}Pb$, $^{113}Sn$, $^{123}Sn$, $^{126}Sn$, or a combination thereof. In some examples, the perovskite can comprise $MAPbI_3$, $MAPbBr_3$, $MAPbCl_3$, $MAPbBr_{2.94}Cl_{0.06}$, $MAPbBr_{2.85}Cl_{0.15}$, $FAPbI_3$, $FAPbBr_3$, $BAPbI_3$, $BAPbBr_3$, $MASnI_3$, $MASnBr_3$, $FASnI_3$, $FASnBr_3$, $BASnI_3$, $BASnBr_3$, $FA_{0.97}MA_{0.03}PbBr_{2.91}Cl_{0.09}$, $Cs_{0.2}MA_{0.8}PbBr_{2.98}Cl_{0.02}$, or a combination thereof, and the radioactive isotope is $^{3}H$.

In some examples, the perovskite comprises a material defined by the formula $[Q]_2[M][M'][X]_6$ (e.g., a double perovskite), wherein: Q is at least one cation comprising an organic group, an inorganic group, or a combination thereof, M is at least one cation comprising a metal, a metalloid, or a combination thereof, M' is at least one cation comprising a metal, a metalloid, or a combination thereof, and X is at least one anion comprising a halide; with the proviso that at least a portion of Q, M, M', X, or a combination thereof comprises a radioactive isotope having a half-life of 100 days or more. In some examples, Q is methylammonium $CH_3NH_3$ (MA), formamidinium $CH(NH_2)_2$ (FA), n-butylammonium, tetra-butylammonium $C_4H_9NH_3$ (BA), Cs, or a combination thereof. In some examples, M is Cu, Ag, or a combination thereof. In some examples, M' is Bi, Ga, In, or a combination thereof. In some examples, X is I, Cl, Br, or a combination thereof. In some examples, Q is methylammonium $CH_3NH_3$ (MA), formamidinium $CH(NH_2)_2$ (FA), n-butylammonium, tetra-butylammonium $C_4H_9NH_3$ (BA), Cs, or a combination thereof; M is Cu, Ag, or a combination thereof, M' is Bi, Ga, In, or a combination thereof; and X is I, Cl, Br, or a combination thereof.

In some examples, the perovskite comprises:

$$[MA_{a'}FA_{b'}BA_{c'}Cs_{d'}][Cu_kAg_l][Bi_mGa_nIn_p][I_{h'}Cl_{i'}Br_{j'}]$$

wherein: a'-d' are independently 0 to 2; k and l are independently 0 to 1; m-p are independently 0 to 1; h'-j' are independently 0 to 6; the sum of a'-d' is 2; the sum of k and l is 1; the sum of m-p is 1; and the sum of h'-j' is 6.

For example, a'-d' can independently be 0 or more (e.g., 0.1 or more, 0.2 or more, 0.3 or more, 0.4 or more, 0.5 or more, 0.6 or more, 0.7 or more, 0.8 or more, 0.9 or more, 1 or more, 1.1 or more, 1.2 or more, 1.3 or more, 1.4 or more, 1.5 or more, 1.6 or more, 1.7 or more, 1.8 or more, or 1.9 or more). In some examples, a'-d' can independently be 2 or less (e.g., 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less). The values of a'-d' can independently range from any of the minimum values described above to any of the maximum values described above. For example, a'-d' can independently be from 0 to 2 (e.g., from 0 to 1, from 1 to 2, from 0 to 0.4, from 0.4 to 0.8, from 0.8 to 1.2, from 1.2 to 1.6, from 1.6 to 2, from 0.1 to 2, from 0 to 1.9, or from 0.1 to 1.9).

In some examples, k, l, m, n, and p can independently be 0 or more (e.g., 0.1 or more, 0.2 or more, 0.3 or more, 0.4 or more, 0.5 or more, 0.6 or more, 0.7 or more, 0.8 or more, or 0.9 or more). In some examples, k, l, m, n, and p can independently be 1 or less (e.g., 0.9 or less, 0.8 or less, 0.7 or less, 0.6 or less, 0.5 or less, 0.4 or less, 0.3 or less, 0.2 or less, or 0.1 or less). The values of k, l, m, n, and p can independently range from any of the minimum values described above to any of the maximum values described above. For example, k, l, m, n, and p can independently be from 0 to 1 (e.g., from 0 to 0.5, from 0.5 to 1, from 0 to 0.2, from 0.2 to 0.4, from 0.4 to 0.6, from 0.6 to 0.8, from 0.8 to 1, from 0 to 0.9, from 0.1 to 1, or from 0.1 to 0.9).

In some examples, h'-j' are independently 0 or more (e.g., 0.1 or more, 0.2 or more, 0.3 or more, 0.4 or more, 0.5 or more, 0.6 or more, 0.7 or more, 0.8 or more, 0.9 or more, 1 or more, 1.1 or more, 1.2 or more, 1.3 or more, 1.4 or more, 1.5 or more, 1.6 or more, 1.7 or more, 1.8 or more, 1.9 or more, 2 or more, 2.1 or more, 2.2 or more, 2.3 or more, 2.4 or more, 2.5 or more, 2.6 or more, 2.7 or more, 2.8 or more, 2.9 or more, 3 or more, 3.1 or more, 3.2 or more, 3.3 or more, 3.4 or more, 3.5 or more, 3.6 or more, 3.7 or more, 3.8 or more, 3.9 or more, 4 or more, 4.1 or more, 4.2 or more, 4.3 or more, 4.4 or more, 4.5 or more, 4.6 or more, 4.7 or more, 4.8 or more, 4.9 or more, 5 or more, 5.1 or more, 5.2 or more, 5.3 or more, 5.4 or more, 5.5 or more, 5.6 or more, 5.7 or more, 5.8 or more, or 5.9 or more). In some examples, h'-j' are independently 6 or less (e.g., 5.9 or less, 5.8 or less, 5.7 or less, 5.6 or less, 5.5 or less, 5.4 or less, 5.3 or less, 5.2 or less, 5.1 or less, 5 or less, 4.9 or less, 4.8 or less, 4.7 or less, 4.6 or less, 4.5 or less, 4.4 or less, 4.3 or less, 4.2 or less, 4.1 or less, 4 or less, 3.9 or less, 3.8 or less, 3.7 or less, 3.6 or less, 3.5 or less, 3.4 or less, 3.3 or less, 3.2 or less, 3.1 or less, 3 or less, 2.9 or less, 2.8 or less, 2.7 or less, 2.6 or less, 2.5 or less, 2.4 or less, 2.3 or less, 2.2 or less, 2.1 or less, 2 or less, 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less). The values of h'-j' can independently range from any of the minimum values described above to any of the maximum values described above. For example, h'-j' can independently be from 0 to 6 (e.g., from 0 to 3, from 3 to 6, from 0 to 2, from 2 to 4, from 4 to 6, from 0.1 to 6, from 0 to 5.9, or from 0.1 to 5.9).

In some examples, the perovskite comprises a material defined by the formula $[Q]_2[M][M'][X]_6$ and is a lead-free perovskite.

In some examples, the perovskite comprises a material defined by the formula $[Q]_2[M][M'][X]_6$ and the radioactive isotope is $^{108m}$Ag, $^{110m2}$Ag, $^{207}$Bi, $^{208}$Bi, $^{209}$Bi, $^{210m}$Bi, $^{14}$C, $^{36}$Cl, $^{134}$Cs, $^{135}$Cs, $^{137}$Cs, $^3$H, $^{129}$I, $^{115}$In, $^{113}$Sn, $^{123}$Sn, $^{126}$Sn, or a combination thereof. In some examples, the perovskite comprises a material defined by the formula $[Q]_2[M][M'][X]_6$ and the radioactive isotope is $^{108m}$Ag, $^{110m2}$Ag, $^{207}$Bi, $^{208}$Bi, $^{209}$Bi, $^{210m}$Bi, $^{36}$Cl, $^{134}$Cs, $^{135}$Cs, $^3$H, $^{129}$I, $^{115}$In, $^{113}$Sn, $^{123}$Sn, $^{126}$Sn, or a combination thereof. In some examples, the perovskite comprises a material defined by the formula $[Q]_2[M][M'][X]_6$ and the radioactive isotope is $^3$H.

In some examples, the perovskite comprises $Cs_2AgBiBr_6$. In some examples, the perovskite comprises $Cs_2AgBiBr_6$ and the radioactive isotope is $^{108m}$Ag, $^{110m2}$Ag, $^{207}$Bi, $^{208}$Bi, $^{209}$Bi, $^{210m}$Bi, $^{134}$Cs, $^{135}$Cs, $^{137}$Cs, or a combination thereof. In some examples, the perovskite comprises $Cs_2AgBiBr_6$ and the radioactive isotope is $^{108m}$Ag, $^{110m2}$Ag, $^{207}$Bi, $^{208}$Bi, $^{209}$Bi, $^{210}$, $^{210m}$Bi, $^{134}$Cs, $^{135}$Cs, or a combination thereof.

In some examples, the perovskite comprises $Cs_4Eu[X]_6$, $Cs_4Pb[X]_6$, $CsPb_2[X]_5$, or a combination thereof, wherein X is one or more anions comprising a halide (e.g., I, Cl, Br, or a combination thereof). In some examples, the perovskite comprises $Cs_4Eu[X]_6$, $Cs_4Pb[X]_6$, $CsPb_2[X]_5$, or a combination thereof, wherein X is one or more anions comprising a halide e.g., I, Cl, Br, or a combination thereof) and the radioactive isotope is $^{36}$Cl, $^{134}$Cs, $^{135}$Cs, $^{137}$Cs, $^{150}$Eu, $^{152}$Eu, $^{154}$Eu, $^{155}$Eu, $^{129}$I, $^{202}$Pb, $^{205}$Pb, $^{210}$Pb, or a combination thereof. In some examples, the perovskite comprises $Cs_4Eu[X]_6$, $Cs_4Pb[X]_6$, $CsPb_2[X]_5$, or a combination thereof, wherein X is one or more anions comprising a halide e.g., I, Cl, Br, or a combination thereof) and the radioactive isotope is $^{36}$Cl, $^{134}$Cs, $^{135}$Cs, $^{150}$Eu, $^{152}$Eu, $^{154}$Eu, $^{155}$Eu, $^{129}$I, $^{202}$Pb, $^{205}$Pb, $^{210}$Pb, or a combination thereof.

In some examples, the perovskite comprises $MAPbI_3$, $MAPbBr_3$, $MAPbCl_3$, $MAPbBr_{2.94}Cl_{0.06}$, $MAPbBr_{2.85}Cl_{0.15}$, $FA_{0.97}MA_{0.03}PbBr_{2.91}Cl_{0.09}$, $Cs_{0.2}MA_{0.8}PbBr_{2.98}Cl_{0.02}$, $CsPbBr_3$, $FAPbBr_3$, $FA_{0.97}MA_{0.03}PbBr_{2.91}Cl_{0.09}$, $Cs_2AgBiBr_6$, or a combination thereof. In some examples, the perovskite comprises $MAPbI_3$, $MAPbBr_3$, $MAPbCl_3$, $MAPbBr_{2.94}Cl_{0.06}$, $MAPbBr_{2.85}Cl_{0.15}$, $FA_{0.97}MA_{0.03}PbBr_{2.91}Cl_{0.09}$, $Cs_{0.2}MA_{0.8}PbBr_{2.98}Cl_{0.02}$, $CsPbBr_3$, $FAPbBr_3$, $FA_{0.97}MA_{0.03}PbBr_{2.91}Cl_{0.09}$, $Cs_{0.2}MA_{0.8}PbBr_{2.98}Cl_{0.02}$, $Cs_2AgBiBr_6$, or a combination thereof, and the radioactive isotope is $^{108m}$Ag, $^{110m2}$Ag, $^{207}$Bi, $^{208}$Bi, $^{209}$Bi, $^{210m}$Bi, $^{14}$C, $^{36}$Cl, $^{134}$Cs, $^{135}$Cs, $^{157}$Cs, $^3$H, $^{129}$I, $^{202}$Pb, $^{205}$Pb, $^{210}$Pb, or a combination thereof. In some examples, the perovskite comprises $MAPbI_3$, $MAPbBr_3$, $MAPbCl_3$, $MAPbBr_{2.94}Cl_{0.06}$, $MAPbBr_{2.85}Cl_{0.15}$, $FA_{0.97}MA_{0.03}PbBr_{2.91}Cl_{0.09}$, $Cs_{0.2}MA_{0.8}PbBr_{2.98}Cl_{0.02}$, $CsPbBr_3$, $FAPbBr_3$, $FA_{0.97}MA_{0.03}PbBr_{2.91}Cl_{0.09}$, $Cs_2AgBiBr_6$, or a combination thereof, and the radioactive isotope is $^{108m}$Ag, $^{110m2}$Ag, $^{207}$Bi, $^{208}$Bi, $^{209}$Bi, $^{210m}$Bi, $^{36}$Cl, $^{134}$Cs, $^{135}$Cs, $^3$H, $^{129}$I, $^{202}$Pb, $^{205}$Pb, $^{210}$Pb, or a combination thereof. In some examples, the perovskite comprises $MAPbI_3$, $MAPbBr_3$, $MAPbCl_3$, $MAPbBr_{2.94}Cl_{0.06}$, $MAPbBr_{2.85}Cl_{0.15}$, $FA_{0.97}MA_{0.03}PbBr_{2.91}Cl_{0.09}$, $Cs_{0.2}MA_{0.8}PbBr_{2.98}Cl_{0.02}$, $FAPbBr_3$, $FA_{0.97}MA_{0.03}PbBr_{2.91}Cl_{0.09}$, or a combination thereof, and the radioactive isotope is $^3$H.

In some examples, the perovskite comprises $MAPbI_3$, $MAPbBr_3$, $MAPbCl_3$, $MAPbBr_{2.94}Cl_{00.6}$, $MAPbBr_{2.85}Cl_{0.15}$, $FA_{0.97}MA_{0.03}PbBr_{2.91}Cl_{0.09}$, $Cs_{0.2}MA_{0.8}PbBr_{2.98}Cl_{0.02}$, $FAPbBr_3$, $FA_{0.97}MA_{0.03}PbBr_{2.91}Cl_{0.09}$, or a combination thereof. In some examples, the perovskite comprises $MAPbI_3$, $MAPbBr_3$, $MAPbCl_3$, $MAPbBr_{2.94}Cl_{00.6}$, $MAPbBr_{2.85}Cl_{0.15}$, $FA_{0.97}MA_{0.03}PbBr_{2.91}Cl_{0.09}$, $Cs_{0.2}MA_{0.8}PbBr_{2.98}Cl_{0.02}$, $FAPbBr_3$, $FA_{0.97}MA_{0.03}PbBr_{2.91}Cl_{0.09}$, or a combination thereof, and the radioactive isotope is $^{14}$C, $^{36}$Cl, $^{134}$Cs, $^{135}$Cs, $^{137}$Cs, $^3$H, $^{129}$, $^{202}$Pb, $^{205}$Pb, $^{210}$Pb, or a combination thereof. In some examples, the perovskite comprises $MAPbI_3$, $MAPbBr_3$, $MAPbCl_3$, MAPbBr$_{2.94}$Cl$_{0.06}$, MAPbBr$_{2.85}$Cl$_{0.15}$, FA$_{0.97}$MA$_{0.03}$ PbBr$_{2.91}$Cl$_{0.09}$, Cs$_{0.2}$MA$_{0.8}$PbBr$_{2.98}$Cl$_{0.02}$, FAPbBr$_3$, FA$_{0.97}$MA$_{0.03}$PbBr$_{2.91}$Cl$_{0.09}$, or a combination thereof, and the radioactive isotope is $^{36}$Cl, $^{134}$Cs, $^{135}$Cs, $^{3}$H, $^{129}$I, $^{202}$Pb, $^{205}$Pb, $^{210}$Pb, or a combination thereof. In some examples, the perovskite comprises MAPbI$_3$, MAPbBr$_3$, MAPbCl$_3$, MAPbBr$_{2.94}$Cl$_{0.06}$, MAPbBr$_{2.85}$Cl$_{0.15}$, FA$_{0.97}$MA$_{0.03}$ PbBr$_{2.91}$ Cl$_{0.09}$, Cs$_{0.2}$MA$_{0.8}$PbBr$_{2.98}$Cl$_{0.02}$, FAPbBr$_3$, FA$_{0.97}$MA$_{0.03}$PbBr$_{2.91}$Cl$_{0.09}$, or a combination thereof, and the radioactive isotope is $^{3}$H.

In some examples, the perovskite comprises MAPbBr$_3$. In some examples, the perovskite comprises MAPbBr$_3$ and the radioactive isotope is $^{14}$C, $^{3}$H, $^{202}$Pb, $^{205}$Pb, $^{210}$Pb, or a combination thereof. In some examples, the perovskite comprises MAPbBr$_3$ and the radioactive isotope is $^{3}$H, $^{202}$Pb, $^{205}$Pb, $^{210}$Pb, or a combination thereof. In some examples, the perovskite comprises MAPbBr$_3$ and the radioactive isotope is $^{3}$H.

In some examples, the perovskite can comprise a 2D layered perovskite. In some examples, the perovskite can comprise a 2D layered perovskite comprising an Aurivillius phase, a Dion-Jacobson phase, a Ruddlesden-Popper phase, or a combination thereof.

In some examples, the perovskite comprises a 1D perovskite. One example of a 1D perovskite is (NH$_3$C$_2$H$_4$S$_2$C$_2$H$_4$NH$_3$)$_2$PbI$_5$·I.

In some examples, the perovskite comprises 0D perovskites with general formula of Q$_4$ZX$_6$.

The radioactive isotope can, for example, replace 0.1% or more of the non-radioactive counterpart atom in the crystal lattice of the perovskite (e.g., 0.5% or more, 1% or more, 5% or more, 10% or more, 15% or more, 20% or more, 25% or more, 30% or more, 35% or more, 40% or more, 45% or more, 50% or more, 55% or more, 60% or more, 65% or more, 70% or more, 75% or more, 80% or more, 85% or more, 90% or more, 95% or more, or 99% or more). In some examples, the radioactive isotope replaces 100%6 or less of the non-radioactive counterpart atom in the crystal lattice of the perovskite (e.g., 95% or less, 90% or less, 85% or less, 80% or less, 75% or less, 70% or less, 65% or less, 60% or less, 55% or less, 50% or less, 45% or less, 40% or less, 35% or less, 30% or less, 25% or less, 20% or less, 15% or less, 10% or less, 5% or less, 1% or less, or 0.5% or less). The amount of the non-radioactive counterpart atom replaced by the radioactive isotope in the crystal lattice of the perovskite can range from any of the minimum values described above to any of the maximum values described above. For example, the radioactive isotope can replace from 0.1% to 100% of the non-radioactive counterpart atom in the crystal lattice of the perovskite (e.g., from 0.1% to 50%, from 50% to 100%, from 0.1% to 20%, from 20% to 40%, from 40% to 60%, from 60% to 80%, from 80% to 100%, from 1% to 100%, from 5% to 100%, from 10% to 100%, from 25% to 100%, from 50% to 100%, from 75% to 100%, or from 99% to 100%).

In some examples, the device has a radioactivity density of 1×10$^8$ Becquerel (Bq) per cubic centimeter (cm$^3$) or more (e.g., 5×10$^8$ Bq/cm$^3$ or more, 1×10$^9$ Bq/cm$^3$ or more, 5×10$^9$ Bq/cm$^3$ or more, 1×10$^{10}$ Bq/cm$^3$ or more, 5×10$^{10}$ Bq/cm$^3$ or more, 1×10$^{11}$ Bq/cm$^3$ or more, 5×10$^{11}$ Bq/cm$^3$ or more, 1×10$^{12}$ Bq/cm$^3$ or more, or 5×10$^{12}$ Bq/cm$^3$ or more). In some examples, the device has a radioactivity density of 1×10$^{13}$ Bq/cm$^3$ or less (e.g., 5×10$^{12}$ Bq/cm$^3$ or less, 1×10$^{12}$ Bq/cm$^3$ or less, 5×10$^{11}$ Bq/cm$^3$ or less, 1×10$^{11}$ Bq/cm$^3$ or less, 5×10$^{10}$ Bq/cm$^3$ or less, 1×10$^{10}$ Bq/cm$^3$ or less, 5×10$^9$ Bq/cm$^3$ or less, 1×10$^9$ Bq/cm$^3$ or less, or 5×10$^8$ Bq/cm$^3$ or less). The radioactive density of the device can range from any of the minimum values described above to any of the maximum values described above. For example, device can have a radioactive density of from 1×10$^8$ Becquerel (Bq) per cubic centimeter (cm$^3$) to 1×10$^{13}$ Bq/cm$^3$ (e.g., from 1×10$^8$ Bq/cm$^3$ to 5×10$^{10}$ Bq/cm$^3$, from 5×10$^{10}$ Bq/cm$^3$ to 1×10$^{13}$ Bq/cm$^3$, from 1×10$^8$ Bq/cm$^3$ to 1×10$^9$ Bq/cm$^3$, from 1×10$^9$ Bq/cm$^3$ to 1×10$^{10}$ Bq/cm$^3$, from 1×10$^{10}$ Bq/cm$^3$ to 1×10$^{11}$ Bq/cm$^3$, from 1×10$^{11}$ Bq/cm$^3$ to 1×10$^{12}$ Bq/cm$^3$, from 1×10$^{12}$ Bq/cm$^3$ to 1×10$^3$ Bq/cm$^3$, from 5×10$^8$ Bq/cm$^3$ to 1×10$^{13}$ Bq/cm$^3$, from 1×10$^9$ Bq/cm$^3$ to 5×10$^{12}$ Bq/cm$^3$, from 5×10$^8$ Bq/cm$^3$ to 5×10$^{12}$ Bq/cm$^3$, from 1×10$^9$ Bq/cm$^3$ to 1×10$^{13}$ Bq/cm$^3$, from 1×10$^{11}$ Bq/cm$^3$ to 1×10$^{13}$ Bq/cm$^3$).

Also disclosed herein are methods of making any of the devices described herein. For example, also disclosed herein are methods of making any of the perovskite layers or any of the self-illuminating perovskite scintillator layers described herein.

For example, also disclosed herein are methods of making any of the perovskite layers or any of the self-illuminating perovskite scintillator layers described herein, the methods comprising: depositing a precursor solution to form the perovskite layer or the self-illuminating perovskite scintillator layer; wherein the precursor solution comprises a first precursor and a second precursor dissolved in a solvent; and wherein at least a portion of the first precursor, at least a portion of the second precursor, or a combination thereof comprises the one or more radioactive isotopes. Depositing the precursor solution can, for example, comprise printing, spin coating, drop-casting, zone casting, dip coating, blade coating, spraying, vacuum filtration, slot die coating, curtain coating, or combinations thereof. The solvent can, for example, comprise tetrahydrofuran (THF), N-methyl-2-pyrrolidone (NMP), dimethylformamide (DMF), N-methylformamide, formamide, dichloromethane (CH$_2$Cl$_2$), ethylene glycol, polyethylene glycol, glycerol, alkane diol, ethanol, methanol, propanol, isopropanol, acetonitrile, chloroform, toluene, methyl acetate, ethyl acetate, acetone, hexane, heptane, tetraglyme, propylene carbonate, diglyme, dimethyl sulfoxide (DMSO), dimethoxyethane, xylene, dimethylacetamide, or combinations thereof.

For example, also disclosed herein are methods of making any of the perovskite layers or any of the self-illuminating perovskite scintillator layers described herein, the methods comprising: depositing a first precursor solution to form a precursor layer, wherein the first precursor solution comprises a first precursor dissolved in a first solvent; and exposing the precursor layer to a conversion solution that converts the precursor layer to the perovskite, wherein the conversion solution comprises a second precursor dissolved in a second solvent; wherein at least a portion of the first precursor, at least a portion of the second precursor, or a combination thereof comprises the one or more radioactive isotopes. Depositing the first precursor solution can, for example, comprise printing, spin coating, drop-casting, zone casting, dip coating, blade coating, spraying, vacuum filtration, slot die coating, curtain coating, or combinations thereof. The first solvent and the second solvent can be the same or different. The first solvent and the second solvent can independently comprise, for example, tetrahydrofuran (THF), N-methyl-2-pyrrolidone (NMP), dimethylformamide (DMF), N-methylformamide, formamide, dichloromethane (CH$_2$Cl$_2$), ethylene glycol, polyethylene glycol, glycerol, alkane diol, ethanol, methanol, propanol, isopropanol, acetonitrile, chloroform, toluene, methyl acetate, ethyl acetate, acetone, hexane, heptane, tetraglyme, propylene carbonate, diglyme, dimethyl sulfoxide (DMSO), dimethoxyethane, xylene, dimethylacetamide, or combinations thereof.

For example, also disclosed herein are methods of making any of the perovskite layers or any of the self-illuminating perovskite scintillator layers described herein, the methods comprising: depositing a first precursor solution and a second precursor solution; wherein the first precursor solution and the second precursor solution are deposited simultaneously or sequentially; wherein the first precursor solution comprises a first precursor dissolved in a first solvent; wherein the second precursor solution comprises a second precursor dissolved in a second solvent; and wherein at least a portion of the first precursor, at least a portion of the second precursor, or a combination thereof comprises the one or more radioactive isotopes. Depositing the first precursor solution and the second precursor can independently comprise, for example, printing, spin coating, drop-casting, zone casting, dip coating, blade coating, spraying, vacuum filtration, slot die coating, curtain coating, or combinations thereof. The first solvent and the second solvent can be the same or different. The first solvent and the second solvent can independently comprise, for example, tetrahydrofuran (THF), N-methyl-2-pyrrolidone (NMP), dimethylformamide (DMF), N-methylformamide, formamide, dichloromethane ($CH_2Cl_2$), ethylene glycol, polyethylene glycol, glycerol, alkane diol, ethanol, methanol, propanol, isopropanol, acetonitrile, chloroform, toluene, methyl acetate, ethyl acetate, acetone, hexane, heptane, tetraglyme, propylene carbonate, diglyme, dimethyl sulfoxide (DMSO), dimethoxyethane, xylene, dimethylacetamide, or combinations thereof.

For example, also disclosed herein are methods of making any of the perovskite layers or any of the self-illuminating perovskite scintillator layers described herein, the methods comprising: vapor depositing a first precursor and a second precursor; wherein the first precursor and the second precursor are deposited simultaneously or sequentially; and wherein at least a portion of the first precursor, at least a portion of the second precursor, or a combination thereof comprises the one or more radioactive isotopes. Vapor depositing the first precursor and the second precursor can independently comprise, for example, sputtering, pulsed layer deposition, molecular beam epitaxy, evaporation, atomic layer deposition, chemical vapor deposition, or combinations thereof.

For example, also disclosed herein are methods of making any of the perovskite layers or any of the self-illuminating perovskite scintillator layers described herein, the methods comprising high-temperature melting Bridgman growth method and other similar melting growth methods from precursors comprising radioactive isotopes.

For example, also disclosed herein are methods of making any of the perovskite layers or any of the self-illuminating perovskite scintillator layers described herein, the methods comprising solution growth methods from precursors comprising radioactive isotopes.

Also described herein are methods of use of any of the charge or electricity generating devices described herein. The charge or electricity generating devices described herein can, for example, be used to convert radiation to electricity. The devices described herein can convert radiation to electricity with an efficiency of 1% or more (e.g., 5% or more, 10% or more, 15% or more, 20% or more, 25% or more, or 30% or more).

For example, also described herein are methods of use of any of the charge or electricity generating devices described herein, the method comprising using the charge or electricity generating device as a power source for: a device used in deep sea exploration, a device used in interplanetary and/or interstellar exploration, implantable medical devices (IMD) (e.g., deep brain neurostimulators, cochlear implants, gastric stimulators, cardiac defibrillators, cardiac pacemakers, foot drop implants, insulin pumps, etc.), a device used in polar exploration, military equipment, an automotive application, a microelectronic device, an indicator or sign (e.g., exit sign, traffic sign), or a combination thereof. In some examples, a device can enable at system level a conversion of the existing solar farms for 24 hours electricity production where the internal radiation provides nighttime power output and the sunlight as the primary day time power source.

In some examples, the self-illuminating perovskite scintillator layer can be used as a light source for an indicator, such as for exit signs and/or traffic signs at airport, highway, etc.

The charge or electricity generating devices described herein can be used in various articles of manufacture. Examples of articles of manufacture (e.g., devices) using the charge or electricity generating devices described herein can include, but are not limited to, electronic displays (e.g., televisions, smart phones, smart watches, lights), electronic devices, optical devices, optoelectronic devices, or combination thereof. Examples of articles of manufacture using the devices described herein can include, but are not limited to sensors, devices used in the Internet of Things (IoT), and combinations thereof. Such articles of manufacture can be fabricated by methods known in the art.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

Lead halide perovskites have seen wide applications in various areas, e.g., photo voltaic application, Light Emitting Diodes, photodetectors and so on, because of their superior optoelectronic properties. Herein, charge or electricity generating devices (e.g., batteries such as intrinsic beta voltaic batteries) are described, wherein the devices are formed by growing radiation emitting isotopes (e.g., beta, gamma, alpha) directly into a perovskite material to harvest power either directly from electron-hole production by direct ionization or by in-direct scintillating process, e.g. where light can be produced by radiation inside perovskite and externally received by a commercial off the shelf photovoltaic cell.

The charge or electricity generating devices comprise perovskite layers (either polycrystalline film or single crystal) intrinsically having radioisotope energy sources (e.g., beta particle, gamma ray sources, alpha emitting isotope) as at least a portion of its chemical composition. The radioactive particles emitted from the self-contained radioisotopes can create electrons and holes inside perovskite. There are two approaches to use the radioisotope energy.

Firstly, the electrons and holes generated can be directly harvested to generate electricity. Proper device architectures used for this purpose includes, e.g., Electron/Hole Transport Layers, perovskite p-n junctions, metal-semiconductor junction.

Secondly, the electrons and holes may recombine to emit light, which makes the self-illuminating perovskite a scintillator energy source. Then commercial off-the-shelf photovoltaic cells are used to collect lights for electricity generation.

The advantages of these charge or electricity generating devices comprising perovskites with intrinsic radioactive isotopes include, but are not limited to: 1) low cost of the perovskite materials and solution growth methods, 2) no external energy sources are needed to produce electricity, 3) long isotope half-life provides long battery life (e.g., decades), 4) radioisotopes chemically incorporated into crystal lattice sites of the perovskite allow for high energy density and little influence on the perovskite properties.

By using precursors comprising radioactive isotopes (e.g., radioisotopes) that are the necessary chemical compositions of perovskites (e.g., lead or lead-free halide perovskites), the perovskites (e.g., lead or lead-free halide perovskites) can be grown intrinsically with radioactive energy sources in itself, e.g., alpha particle sources, beta particle sources (e.g., tritium as replacement of hydrogen) or gamma ray sources (e.g., Cs-137 as replacement of stable Cs-133).

Specifically, the necessary non-radioactive chemical composition of perovskites in the ordinary precursors are replaced, at least in part, by radioisotopes. During the perovskite crystal growth process, the radioisotopes can be chemically grown into normal crystal lattice sites, making the perovskite intrinsically have radioactive energy sources. In other words, the radioisotopes can form a constitute element of the necessary chemical compositions of the perovskite crystal itself (FIG. 1).

One example is given at below: Carbon and hydrogen are necessary chemical components of organic-inorganic perovskites, such as $CH_3NH_3PbX_3$, with X being Br, I, or Cl. By replacing $_1^1H$ with $_1^3H$ (tritium) or replacing $_6^{12}C$ with $_6^{14}C$, the $CH_3NH_3^+$ precursor contains radioisotopes itself and hence becomes a beta emitter. After the radioactive $CH_3NH_3^+$ precursor is grown into perovskite crystal, the beta emitter is incorporated into perovskite forming the necessary lattice sites.

The same principles apply to other precursors and other perovskites. Examples of radioisotopes and perovskites that can be used for the charge or electricity generating devices comprising perovskites with intrinsic radioactive isotopes include, but are not limited to, those listed in Table 1.

TABLE 1

Example Perovskites with intrinsic radioisotopes.

| Perovskite Type | Elements in precursor | Radioisotopes that can be used |
|---|---|---|
| $ABX_3$ | $A = CH_3NH_3$, $HC(NH_2)_2+$, or $Cs^+$ | $^{14}C$, $^3H$, $^{137}Cs$ |
| $A_2MM'X_6$ | $B = Pb^{2+}$, or $Sn^{2+}$ | $^{210}Pb$, $^{126}Sn$ |
| $Cs_4EuX_6$ | $X = Cl^-$, $Br^-$, or $I^-$ | $^{36}Cl$, $^{129}I$ |
| $Cs_4PbX_6$ | $M = Cu^+$, or $Ag^+$ | $^{108m}Ag$ |
| $CsPb_2X_5$ | $M' = Bi^{3+}$, $Ga^{3+}$, or $In^{3+}$ | $^{208}Bi$, $^{210m}Bi$, $^{209}Bi$, $^{115}In$ |
| | $Eu^{2+}$ | $^{152}Eu$, $^{154}Eu$, $^{155}Eu$ |

The actual chemical composition of perovskites are tunable. For example, the A+ cation can be made of two different cations with certain molar ratio, that is $A_xA'_{1-x}BX_3$. The other parts can also be tuned, e.g., $B^{2+}$ or $X^-$, to change the chemical composition.

Other than the perovskites having formula of $ABX_3$ or $A_2MM'X_6$, $Cs_4EuX_6$, $Cs_4PbX_6$, $CsPb_2X_5$, other perovskites that can be used include, but are not limited to, $MAPbBr_{2.94}Cl_{0.06}$, $MAPbBr_{2.85}Cl_{0.15}$, $FA_{0.97}MA_{0.03}PbBr_{2.91}Cl_{0.09}$, $Cs_{0.2}MA_{0.8}PbBr_{2.98}Cl_{0.02}$, and combinations thereof.

Figure 2:
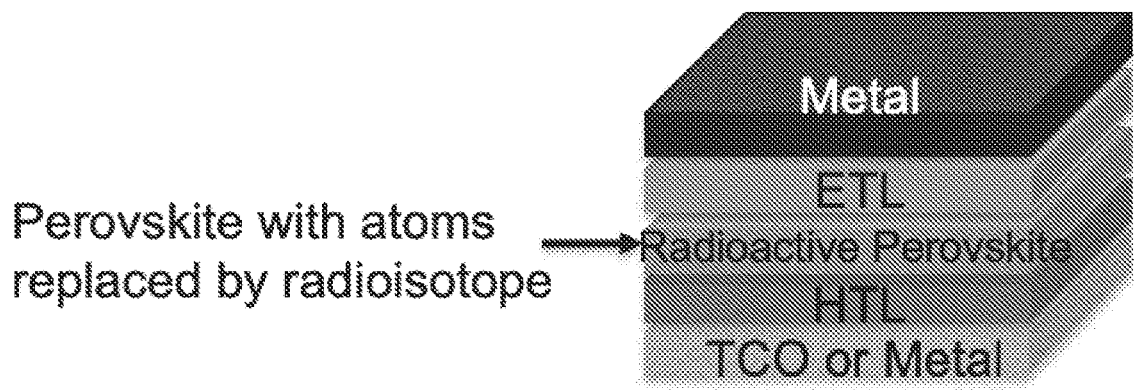
FIG. 2 is a schematic diagram of an example charge or electricity generating device comprising perovskites with intrinsic radioactive isotopes for direct electron-hole harvesting comprising an ETL/perovskite/HTL structure.
Figure 3:
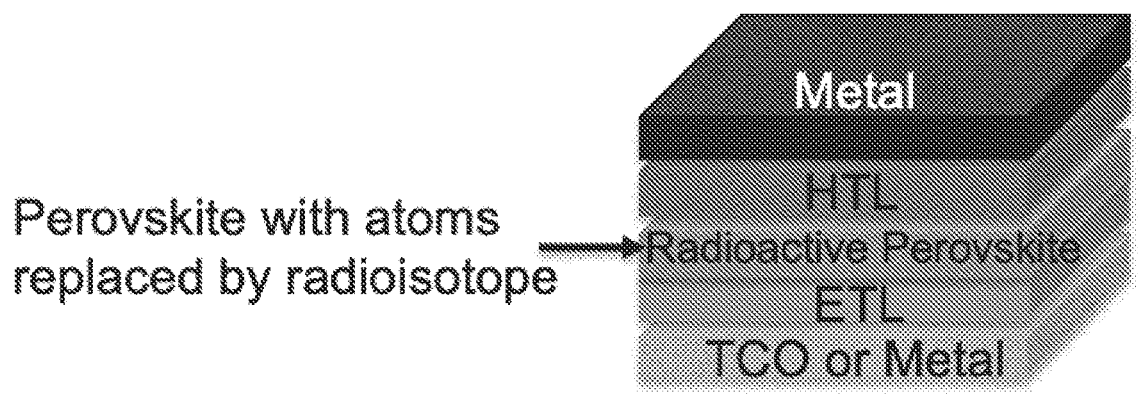
FIG. 3 is a schematic diagram of an example charge or electricity generating device comprising perovskites with intrinsic radioactive isotopes for direct electron-hole harvesting comprising an ETL/perovskite/HTL structure.

Schematic diagrams of example charge or electricity generating devices comprising perovskites with intrinsic radioactive isotopes for direct electron-hole harvesting comprising an ETL/perovskite/HTL structure are shown in FIG. 2 and FIG. 3, where ETL stands for Electron Transport Layer, HTL stands for Hole Transport Layer, and TCO stands for Transparent Conducting Oxide. In the example batteries shown in FIG. 2 and FIG. 3, the perovskite layer with intrinsic radioisotopes is sandwiched between the electron transport layer and hole transport layer. These three layers are then sandwiched between a metal layer and a further layer comprising a transparent conducting oxide or a metal.

Figure 4:
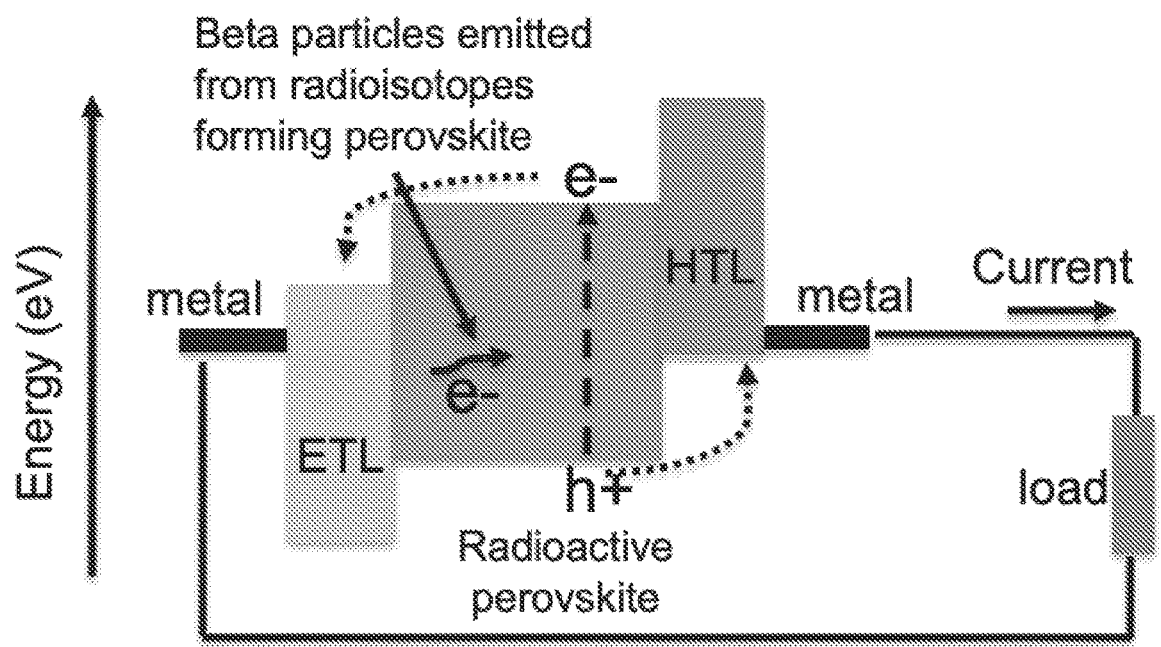
FIG. 4 is a schematic diagram of the working principle for direct electron-hole harvesting from the types of charge or electricity generating devices shown in FIG. 2 and FIG. 3.

The working principle for direct electron-hole harvesting from these types of charge or electricity generating devices comprising perovskites with intrinsic radioactive isotopes is shown in FIG. 4. The perovskite with intrinsic radioisotopes as its chemical composition emit radioactive particles (e.g., beta, gamma, alpha) inside the perovskite crystal. These radioactive particles create electron-hole pairs inside the perovskite crystal. The electrons and holes are then transported out of the perovskite through the ETL and HTL, respectively, to generate current.

Figure 5:
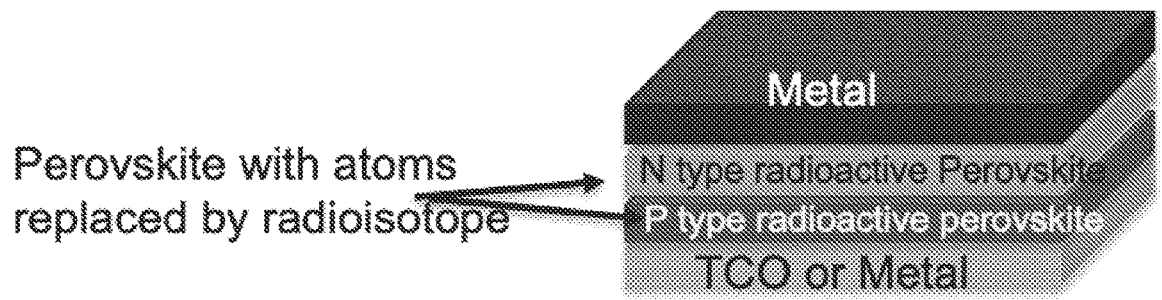
FIG. 5 is a schematic diagram of an example charge or electricity generating devices comprising perovskites with intrinsic radioactive isotopes for direct electron-hole harvesting comprising a perovskite p-n structure.
Figure 6:
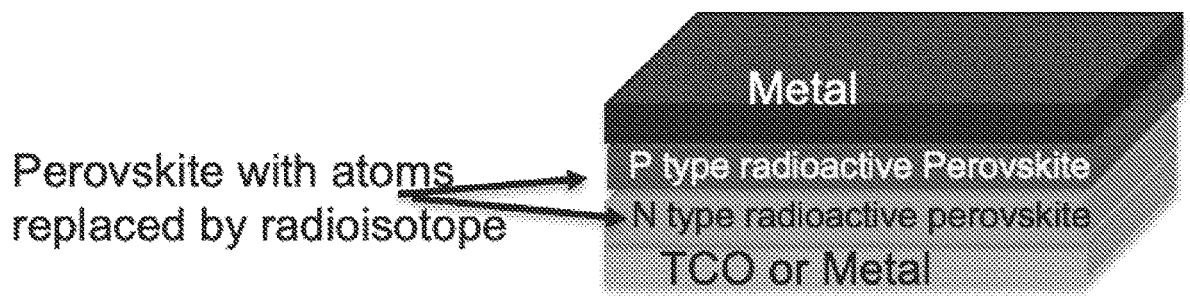
FIG. 6 is a schematic diagram of an example charge or electricity generating devices comprising perovskites with intrinsic radioactive isotopes for direct electron-hole harvesting comprising a perovskite p-n structure.

Schematic diagrams of example charge or electricity generating devices comprising perovskites with intrinsic radioactive isotopes for direct electron-hole harvesting comprising a perovskite p-n structure are shown in FIG. 5 and FIG. 6. Perovskite crystals with an intrinsic p-n junction can be grown directly from solution. By using solution growth, an n-type perovskite crystal can be grown on top of a p-type perovskite crystal, or vice versa, making the whole perovskite crystal have an intrinsic p-n junction structure, which can eliminate the prost-growth processes traditionally used to make perovskite crystal p-n junctions.

Figure 7:
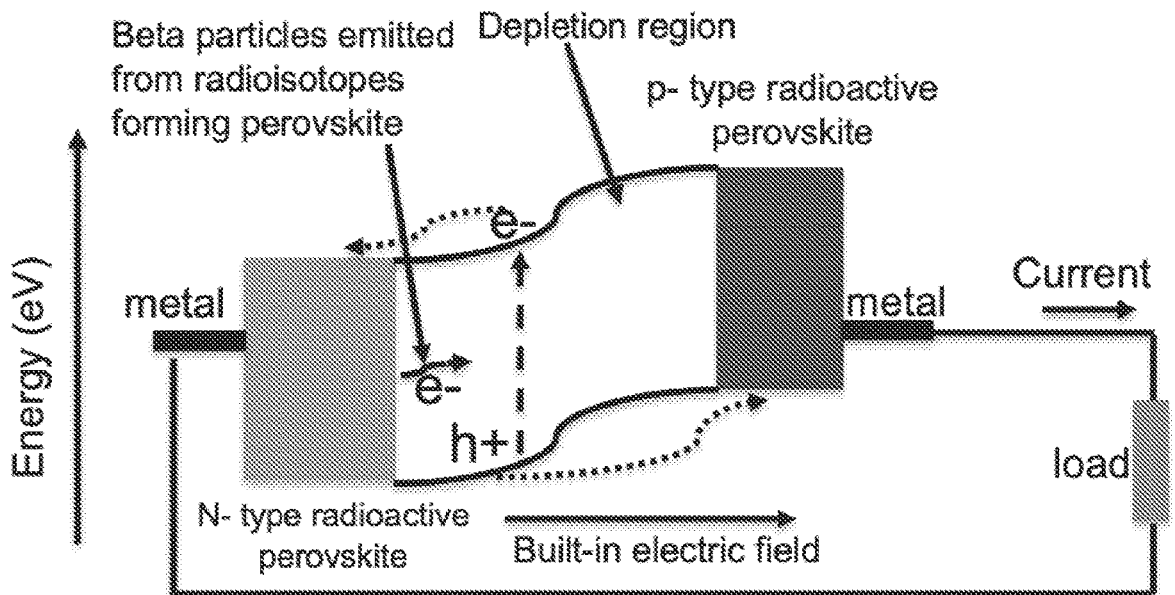
FIG. 7 is a schematic diagram of the working principle for direct electron-hole harvesting from the types of charge or electricity generating devices shown in FIG. 5 and FIG. 6.

The working principle for direct electron-hole harvesting from these types of charge or electricity generating devices comprising perovskites with intrinsic radioactive isotopes for direct electron-hole harvesting comprising a perovskite p-n structures is shown in FIG. 7. A built-in electric field exists in the depletion region of the perovskite p-n junction. Self-emitted radioactive particles create electron-hole pairs inside the perovskite crystal. The electrons and holes are separated by the built-in electric field and collected at the electrodes to generate current.

Figure 8:
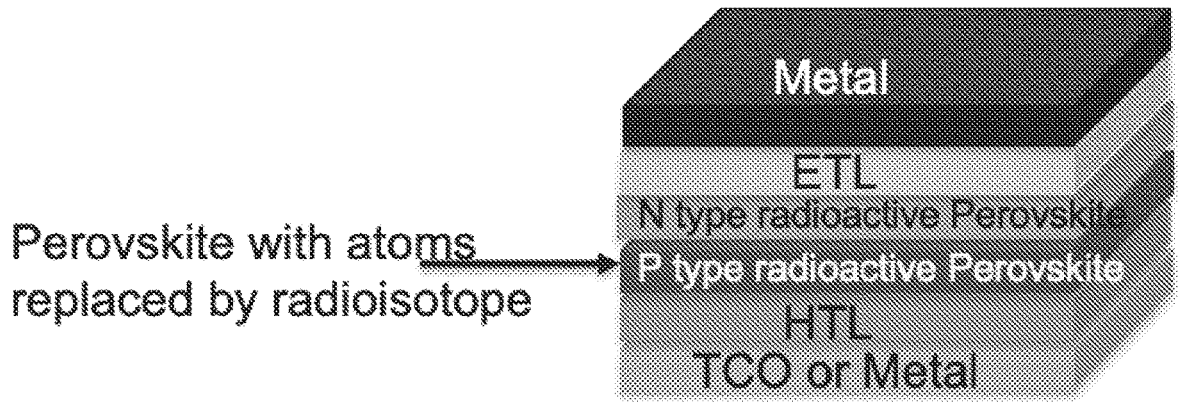
FIG. 8 is a schematic diagram of an example charge or electricity generating device comprising perovskites with intrinsic radioactive isotopes for direct electron-hole harvesting comprising an ETL/n-type perovskite/p-type perovskite/HTL structure.
Figure 9:
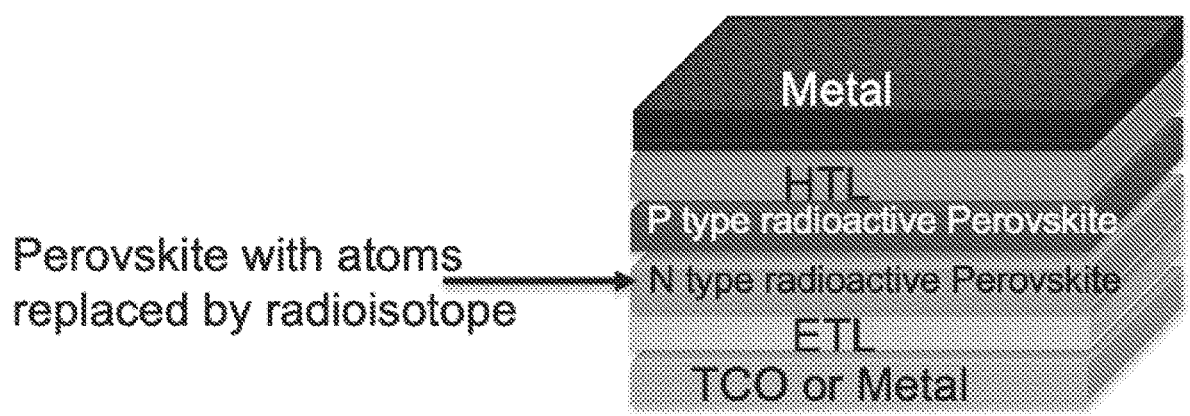
FIG. 9 is a schematic diagram of an example charge or electricity generating device comprising perovskites with intrinsic radioactive isotopes for direct electron-hole harvesting comprising an ETL/n type perovskite/p-type perovskite/HTL structure.

The ETL/perovskite/HTL structure can also be combined with the perovskite p-n junction structure to form an ETL/n type perovskite/p-type perovskite/HTL structure. Schematic diagrams of example charge or electricity generating devices comprising perovskites with intrinsic radioactive isotopes for direct electron-hole harvesting comprising an ETL/n type perovskite/p-type perovskite/HTL structure are shown in FIG. 8 and FIG. 9.

Figure 10:
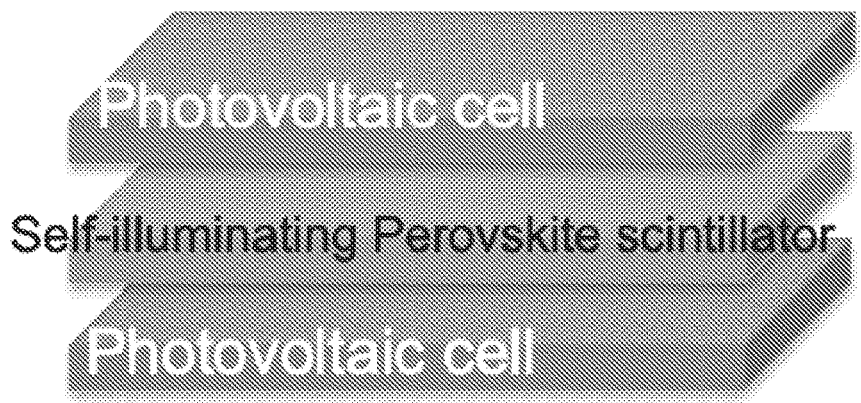
FIG. 10 is a schematic diagram of an example charge or electricity generating device comprising perovskites with intrinsic radioactive isotopes comprising a self-powered scintillator energy source.
Figure 11:
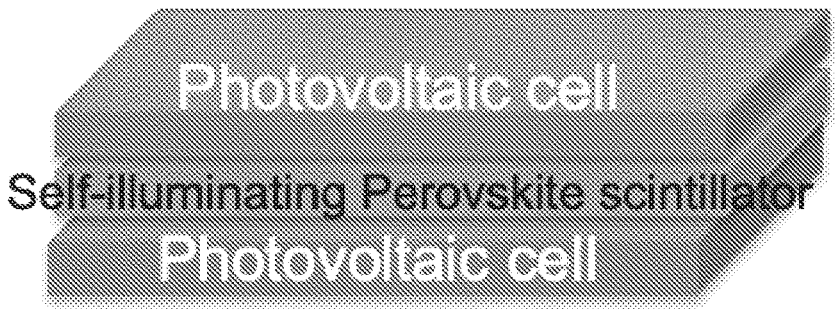
FIG. 11 is a schematic diagram of an example charge or electricity generating device comprising perovskites with intrinsic radioactive isotopes comprising a self-powered scintillator energy source.
Figure 12:
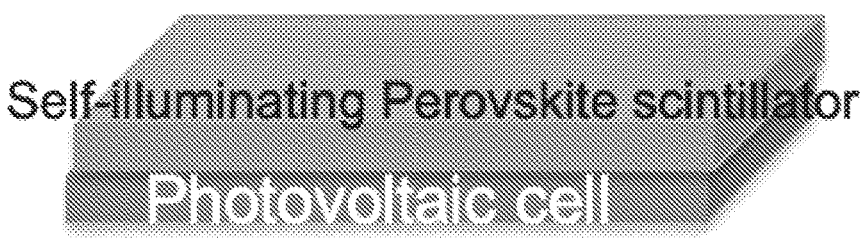
FIG. 12 is a schematic diagram of an example charge or electricity generating device comprising perovskites with intrinsic radioactive isotopes comprising a self-powered scintillator energy source.

Schematic diagrams of example charge or electricity generating devices comprising perovskites with intrinsic radioactive isotopes comprising a self-illuminating scintillator energy source are shown in FIG. 10-FIG. 12. In FIG. 10, a self-illuminating perovskite scintillator is sandwiched between photovoltaic cells where a gap exists between the self-illuminating perovskite scintillator and the photovoltaic cells. In FIG. 11, the self-illuminating perovskite scintillator is sandwiched between photovoltaic cells where the self-illuminating perovskite scintillator and photovoltaic cells are in close contact. In FIG. 12, the photovoltaic cell exists only on one side of the self-illuminating perovskite scintillator.

The structures in FIG. 10-FIG. 12 can be used to harvest energy from the self-illuminating perovskite scintillator. In FIG. 10-FIG. 12, the self-illuminating perovskite scintillator is the perovskite with intrinsic radioactive energy source. The photovoltaic cells can, for example, be commercial off-the-shelf photovoltaic cells. Different structures can be used as long as the light emitted from the self-illuminating perovskite scintillator can be intercepted by the photovoltaic cell(s). The available structures include, but are not limited to, those shown in FIG. 10-FIG. 12.

Figure 13:
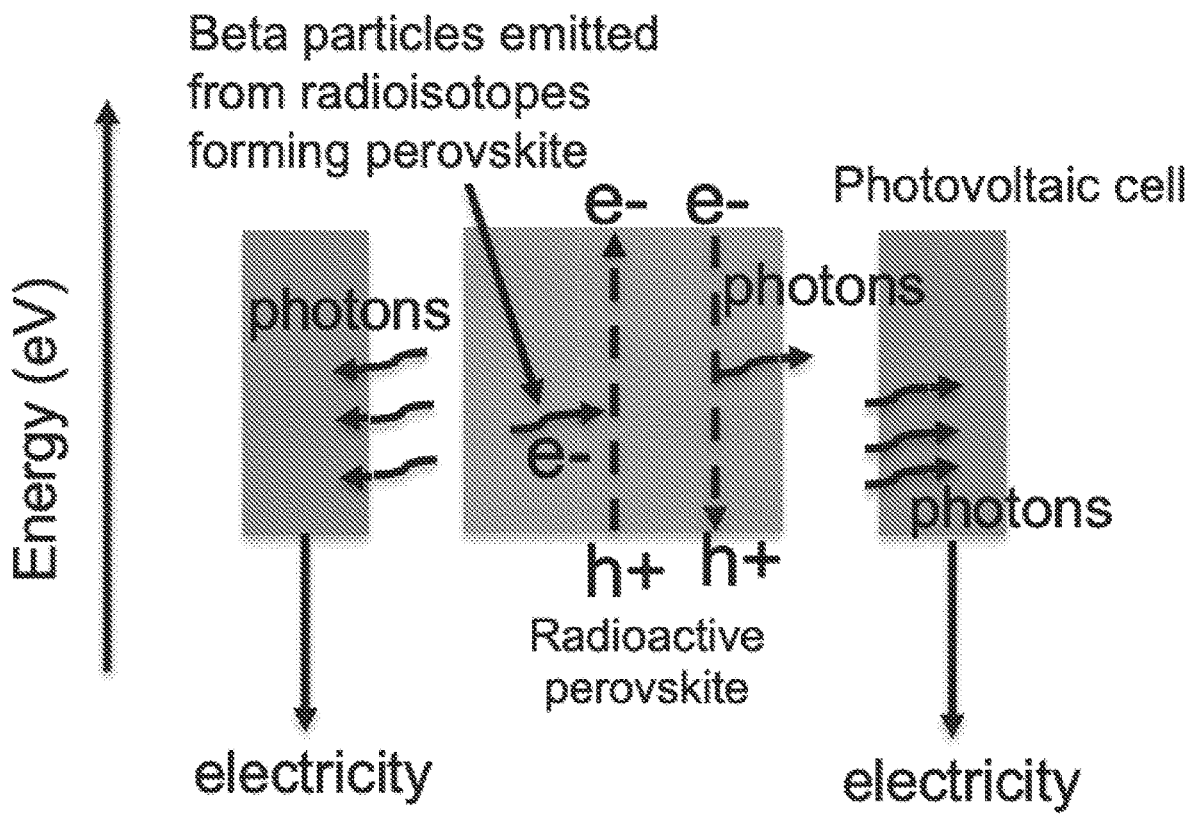
FIG. 13 is a schematic diagram of the working principle for charge or electricity generation from the example charge or electricity generating devices comprising perovskites with intrinsic radioactive isotopes comprising a self-powered scintillator energy source shown in FIG. 10-FIG. 12.

The working principle of charge or electricity generation from the example charge or electricity generating devices comprising perovskites with intrinsic radioactive isotopes comprising a self-illuminating scintillator energy source shown in FIG. 11 and FIG. 12 is shown in FIG. 13. The self-emitted radioactive particles (beta particles, gamma photons) create electrons and holes inside the perovskite. The recombination of the electrons and holes can emit photons. The photons emitted from the self-illuminating perovskite can reach the photovoltaic cell(s) to produce electricity.

Described herein are perovskites with radioisotopes incorporated into to its crystal lattice sites, which has little to no influence on the perovskite properties. While a beta voltaic battery can be an efficient intrinsic battery, most of beta emitting radioisotopes also emit gamma rays. Those low energy gamma or X-rays can also produce power, making a dual mode (beta voltaic and gamma voltaic) battery. High radioisotope density (high energy density) can be produced by incorporation of the radioisotopes into the lattice sites, which can make the charge or electricity generating devices have potentially higher power than traditional nuclear batteries. The ratio of radioisotopes to non-radioisotopes in the perovskite can be controlled by controlling the precursor(s) and growth method. Self-illuminating perovskites can be used in combination with commercial off-the-shelf photovoltaic cells to produce electricity. Self-illuminating perovskites, e.g., using tritium as radioisotope, can be used independently as a light source for an indicator, such as for exit signs and/or traffic signs at airport, highway, etc. The long half-life of the radioisotopes provides a long lifetime for the batteries (e.g., decades) with little to no maintenance. Beta particles can be effectively shielded by a thin sheet of metal, e.g. by one or more metal electrodes.

Wei et al. described a conventional perovskite device, the perovskite comprising $MAPbBr_3$, that demonstrated a significant photoelectric effect under ambient light, which is evidenced by the photocurrent vs. dark current at zero bias (Wei et al. Nature Photonics, 2016, 10(5), 333). A charge or electricity generating device comprising perovskites with intrinsic radioactive isotopes works essentially the same as a conventional photovoltaic perovskite device, except that the radiation energy source (e.g., beta emitter) is part of the chemical composition of the perovskite crystal itself. The photocurrent induced by x-ray irradiation of the devices of Wei et al. was significantly higher than the background noise under −0.1 V bias (Wei et al. Nature Photonics, 2016, 10(5), 333). Meanwhile, the charge or electricity generating device comprising perovskites with intrinsic radioactive isotopes relies on its own built-in electric field, and should operate similarly as there is essentially no difference between applied bias voltage and built-in voltage.

Figure 14:
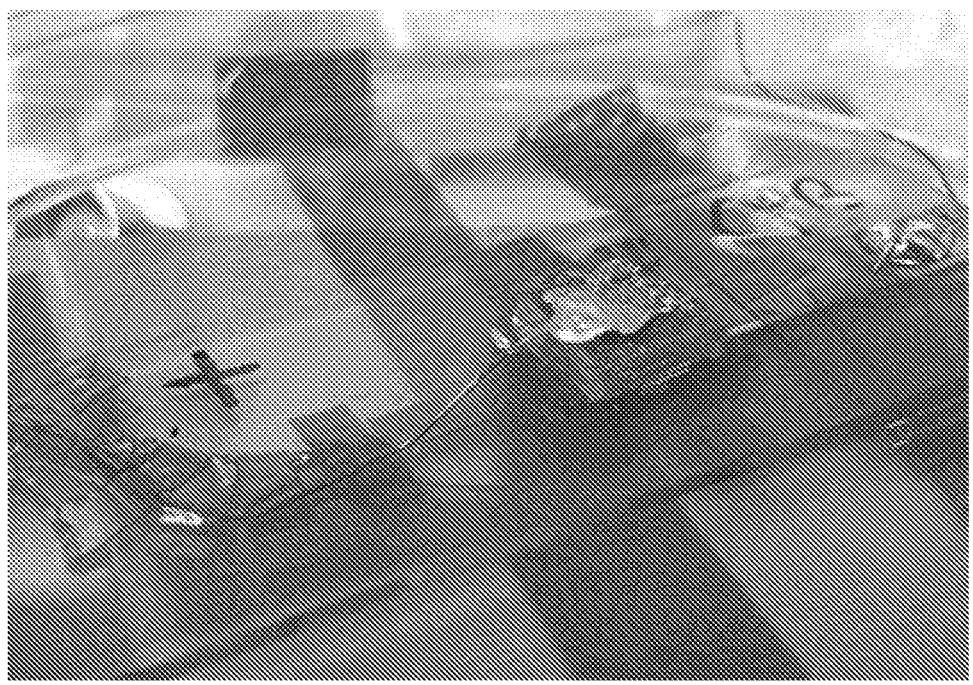
FIG. 14 shows an example traditional $CsPbBr_3$ perovskite device being used as a photodetector.
Figure 15:
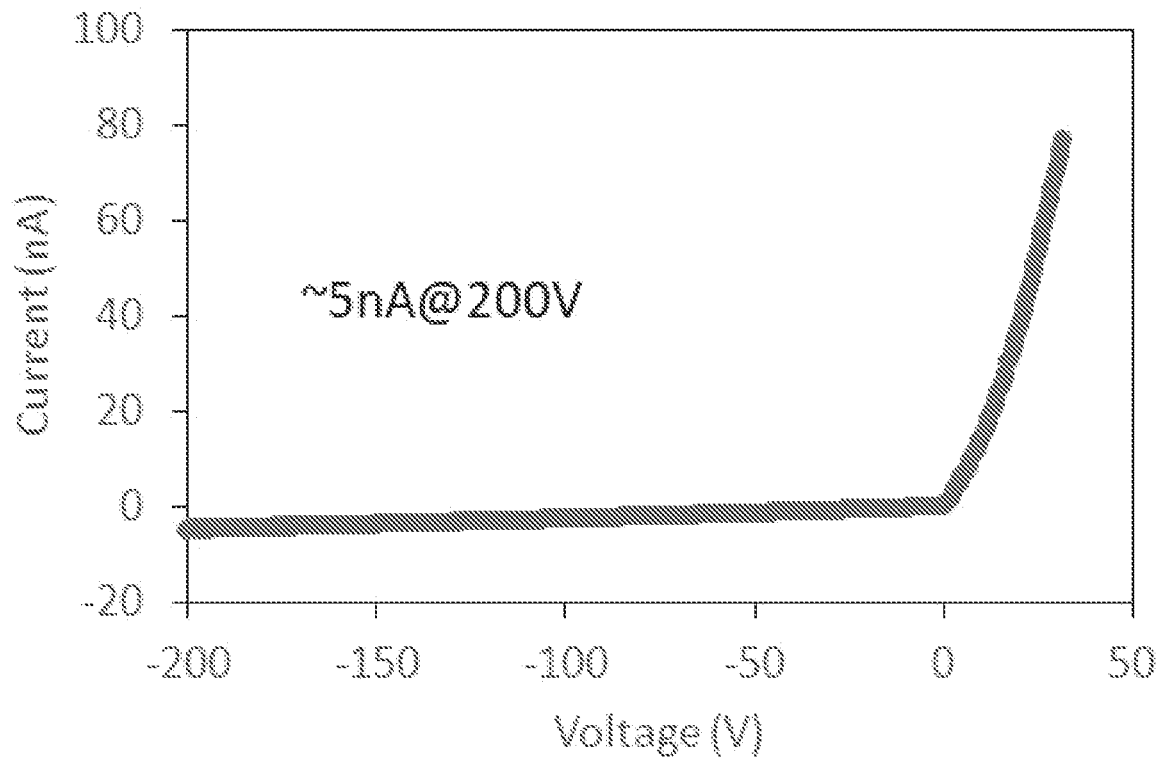
FIG. 15 shows the current-voltage characteristics of a traditional perovskite $CsPbBr_3$ device with a Schottky diode structure.

An example traditional $CsPbBr_3$ perovskite device being used as a photodetector is shown in FIG. 14. The current-voltage characteristics of a traditional perovskite $CsPbBr_3$ device with a Schottky diode structure are shown in FIG. 15. The fabrication and current-voltage characteristics of a charge or electricity generating device comprising perovskites with intrinsic radioactive isotopes is similar to these traditional devices.

Dong et al. describe a conventional $CH_3NH_3PbI_3$ single crystal perovskite device which, with proper structure, can be used in gamma voltaic mode for power supply (Dong et al. Science, 2015, 347(6225), 967-970). The current of the device upon irradiation with a $^{137}Cs$ gamma photon source increased by an order of magnitude relative to the unirradiated current. The charge or electricity generating device comprising perovskites with intrinsic radioactive isotopes eliminates the need for a separate external gamma photon source, as the gamma photon source is intrinsic in the perovskite itself.

Perovskite materials have been tested as rad-hard materials. Yang et al. describe traditional perovskite photovoltaic cells which were subjected to radiation hardness testing (Yang et al. Advanced Materials, 2019, 31(4), 1805547). Yang et al. showed that the hybrid perovskite layers exhibited excellent gamma-ray radiation hardness under continuous light and gamma-ray irradiation with an accumulated gamma-ray does of 2.3 Mrad and a duration time of 1535 hours. Yang et al. further showed that the perovskite photovoltaic cell radiation harness was better than that of Si photovoltaic cells. Yang et al. further showed that the perovskites were even more stable than glass under gamma ray irradiation. The perovskites with intrinsic radioisotopes are thus similarly expected to exhibit excellent radiation hardness.

Example 2

By using tritiated precursor to grow organic-inorganic halide perovskite crystals, e.g., $CH_3NH_3PbBr_3$, or using precursor containing radioactive Cs-137 source to grow inorganic perovskite crystals such as $CsPbBr_3$, the radiation energy source can be incorporated into perovskite crystal itself. Precursors containing other common radioactive Pb, Br, Cl or I isotopes can also be used for growing perovskite crystals, such as Pb-210, Cl-36 and I-129. The perovskites that can be used for charge or electricity generating device comprising perovskites with intrinsic radioactive isotopes (e.g., intrinsic beta voltaic battery fabrication) include but not limited to those listed below: $MAPbBr_3$, $MAPbBr_{2.94}Cl_{0.06}$, $MAPbBr_{2.85}Cl_{0.15}$, $MAPbCl_3$, $FAPbBr_3$, $FA_{0.97}MA_{0.03}PbBr_{2.91}Cl_{0.09}$, $Cs_2AgBiBr_6$, $CsPbBr_3$, $Cs_{0.2}MA_{0.8}PbBr_{2.99}Cl_{0.02}$.

The beta particles (energized electrons) emitted from the tritium atoms or beta particles emitted from Cs-137 atoms and gamma photons emitted from its daughter nucleus, Ba-137 (or any other ionizing particles from radioactive isotopes) can create electron hole pairs inside the perovskite crystal. There are two approaches to make use of the created electron hole pairs. First, the electron hole pairs can be collected by a built-in electric field implemented through proper device structure, e.g. p-n junction or Schottky diode. In this way, the perovskite crystal is working as a charge or electricity generating device. Second, by letting the created electron hole pairs recombine and emit light through proper perovskite materials doping, the perovskite crystal works as a self-illuminated scintillator energy source.

There are several advantages of the charge or electricity generating devices comprising perovskites with intrinsic radioactive isotopes described herein. First, both the raw materials and growth methods for growing perovskite crystals are low in cost, e.g., ~$1/cm³ for organic-inorganic halide perovskite crystals and ~$10/cm³ for inorganic perovskite crystals, which enables cost effective large scale application. Second, charge or electricity generating device comprising perovskites with intrinsic radioactive isotopes eliminates external energy source, which increases their flexibility and versatility for various applications. Besides, the long half-life of the radioisotopes in the perovskite crystals enable the potential use of these charge or electricity generating devices for years or even tens of years with little to no maintenance.

The charge or electricity generating devices comprising perovskites with intrinsic radioactive isotopes described herein can be applied to various industry applications, such as microelectronics powering, space equipment powering, and so on.

Example 3

The estimated power output of $CH_3NH_3PbBr_3$ where some or all of the $^1H$ is replaced by $^3H$ is described below.

The density of $CH_3NH_3PbBr_3$ is 3.6 g/cm³ and the molar mass is 491 g/mol (12+(3*6)+14+207+(80*3)). Therefore, the moles of H in one cubic centimeter (1 cc, 1 cm³) of $CH_3NH_3PbBr_3$ can be calculated as:

$$\frac{3.6 \text{ g}}{491 \text{ g/cm}^3} * 6 = 0.044 \text{ mol}$$

The half-life of $^3H$ is 12.32 years, and the mean energy of a beta particle from $^3H$ is 5.7 keV. Therefore, the activity of $^3H$ in 1 cm³ $CH_3NH_3PbBr_3$ is:

$$A = \lambda n = \frac{\ln(2)}{\tau} * n = \frac{0.693}{12.32 * 365 * 24 * 3600} * 0.044 * 6.022 * 10^{23} = 4.73 * 10^{13} Bq$$

The energy release rate is:

$$W = A * 5.7 \text{ keV} =$$
$$4.73 * 10^{13} Bq * 5.7 \text{ keV} = 4.73 * 10^{13} * 5.7 * 10^{13} * 1.6 * \frac{10^{-19} \text{ J}}{s} = 43.2 \text{ mW}$$

Assuming a 10% power conversion efficiency (PCE), the power output of 1 cm³ $CH_3NH_3PbBr_3$ is 43.2 mW*10%=4.32 mW. In other words, assuming a 10% power conversion efficiency (PCE), $CH_3NH_3PbBr_3$ has a power output density 4.32 mW/cm³.

After one half-life (12.32 years), the power output decays to 4.32/2=2.16 mW or a power output density of 2.16 mW/cm³.

If 25% of the $^1H$ in 1 cm³ of $CH_3NH_3PbBr_3$ is replaced with $^3H$, the power output is 4.32*0.25=1.08 mW, or the power output density is 1.08 mW/cm³.

With 30 cubic centimeters (30 cc) (approximately the volume of a standard C battery), the power output will be 32.4 mW to 129.6 mW, depending on the percent of $^1H$ replaced with $^3H$ (25%-100% substitution).

Example 4

Perovskite ($CH_3NH_3PbI_3$ and $CH_3NH_3PbBr_3$) battery with an external radiation source (X-ray in this case) were tested and showed current output response to X-ray, which is direct evidence of a working radiation voltaic perovskite battery. A beta source should also work in place of the X-ray source for a beta voltaic perovskite battery.

Figure 16:
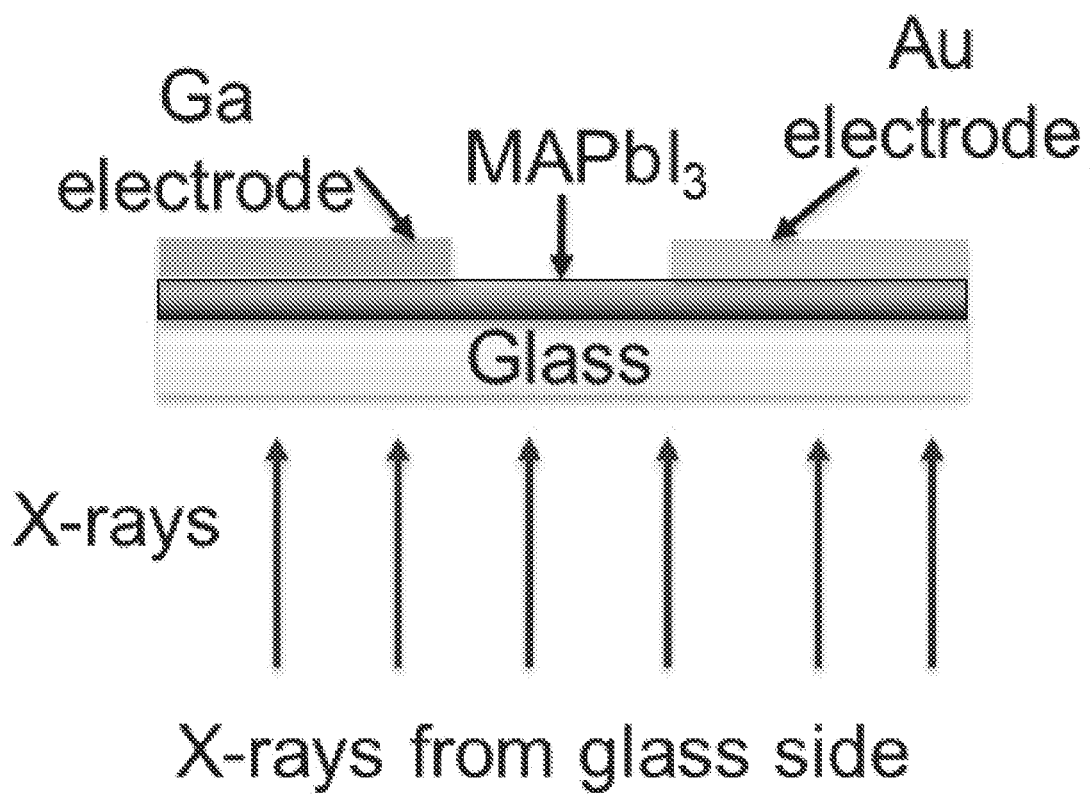
FIG. 16 is a schematic diagram of an example device tested using an X-ray source.
Figure 17:
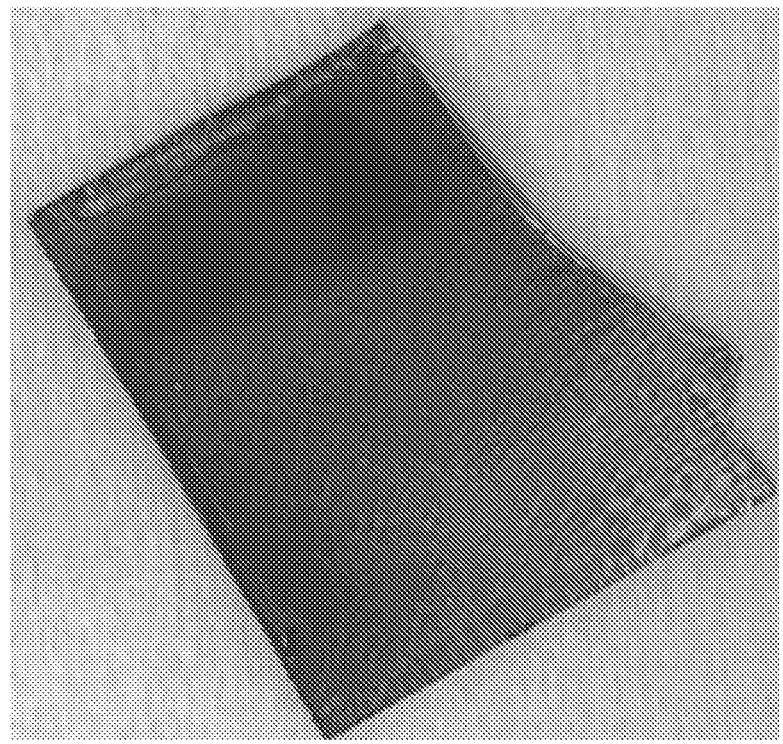
FIG. 17 is a photograph of the device shown schematically in FIG. 16 before the Ga electrode was applied.
Figure 18:
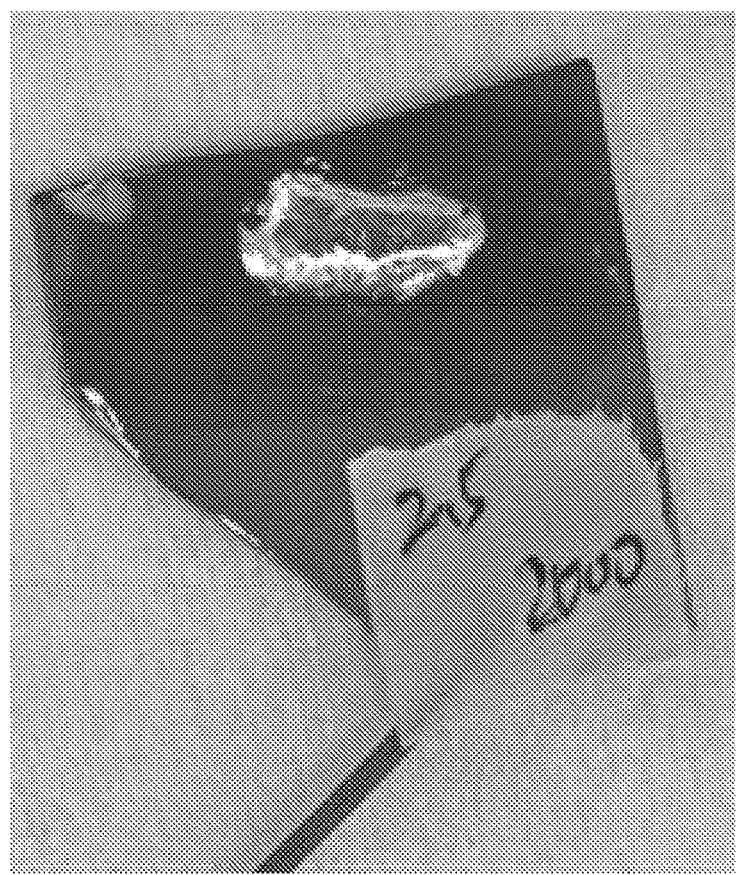
FIG. 18 is a photograph of the device shown in FIG. 17 after the Ga electrode was applied.
Figure 19:
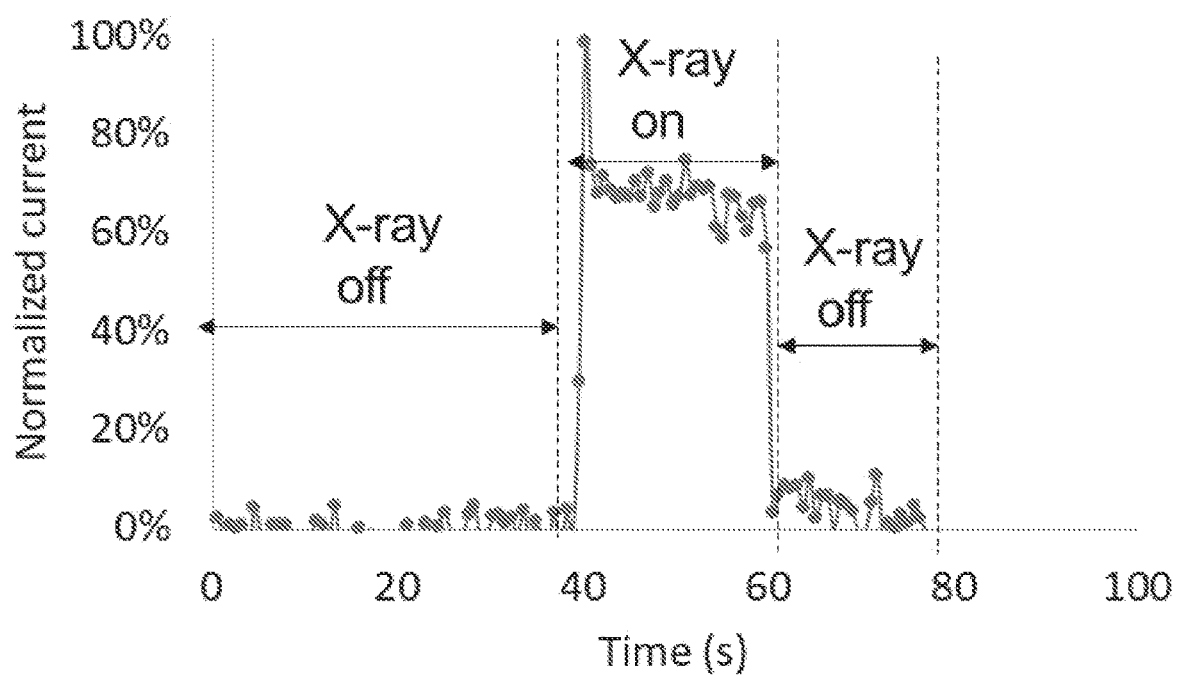
FIG. 19 shows that the perovskite $CH_3NH_3PbI_3$ battery (under 0 bias) produces a current response to an external X-ray source.

The device comprise a perovskite $CH_3NH_3PbI_3$ thin film. The device structure was Ga electrode/perovskite/Au electrode. The device was disposed on glass and has a lateral structure. A schematic of the device tested using an X-ray source is shown in FIG. 16. Photographs of the device before and after the Ga electrode was applied are shown in FIG. 17 and FIG. 18, respectively. The perovskite $CH_3NH_3PbI_3$ battery (under 0 bias) produces a current response to an external X-ray source (FIG. 19).

Figure 20:
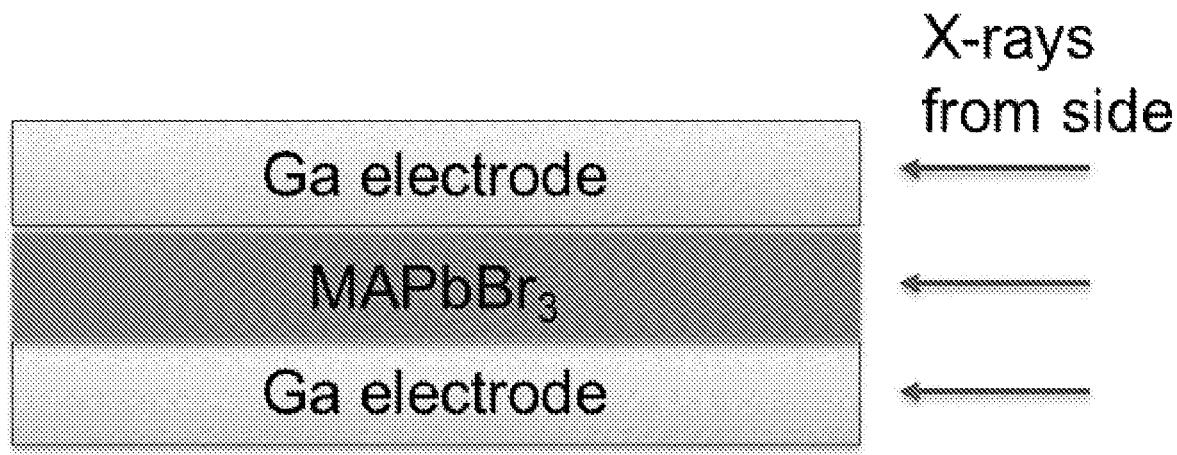
FIG. 20 is a schematic diagram of a vertical structure of Ga electrode/perovskite/Ga electrode device tested using an X-ray source.
Figure 21:
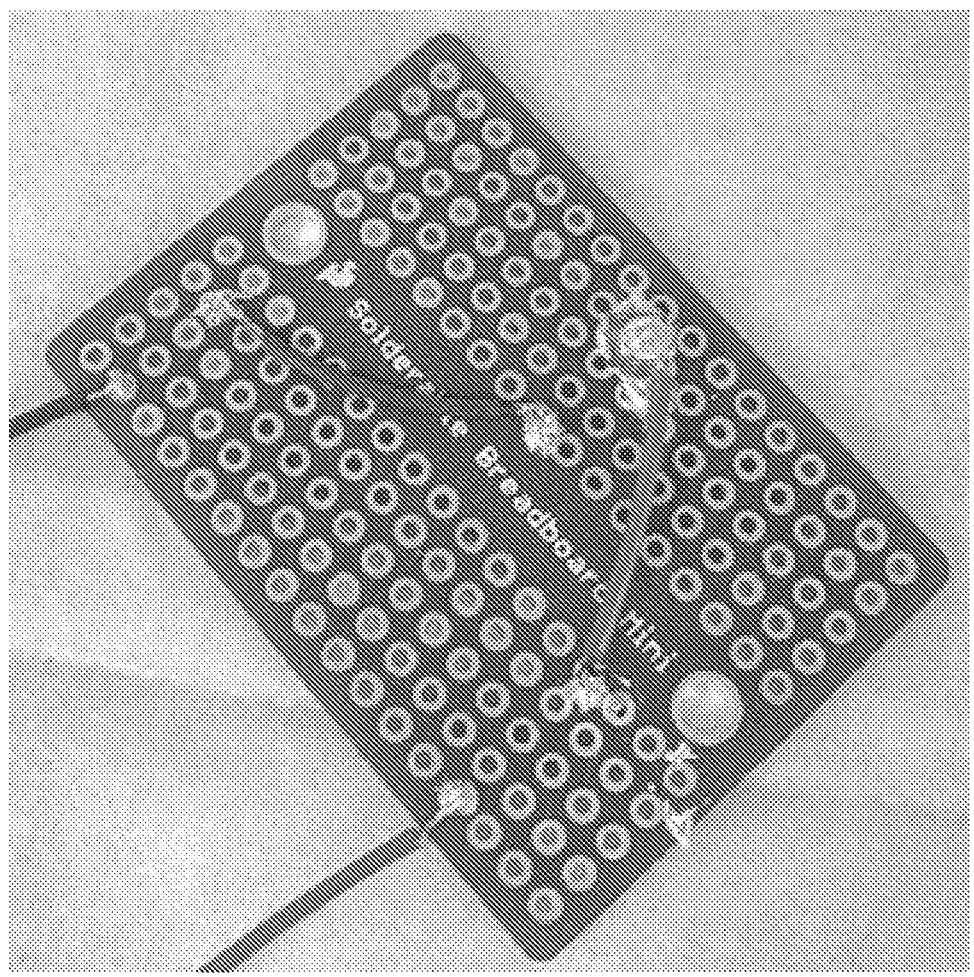
FIG. 21 is a photograph of the device shown schematically in FIG. 20.
Figure 22:
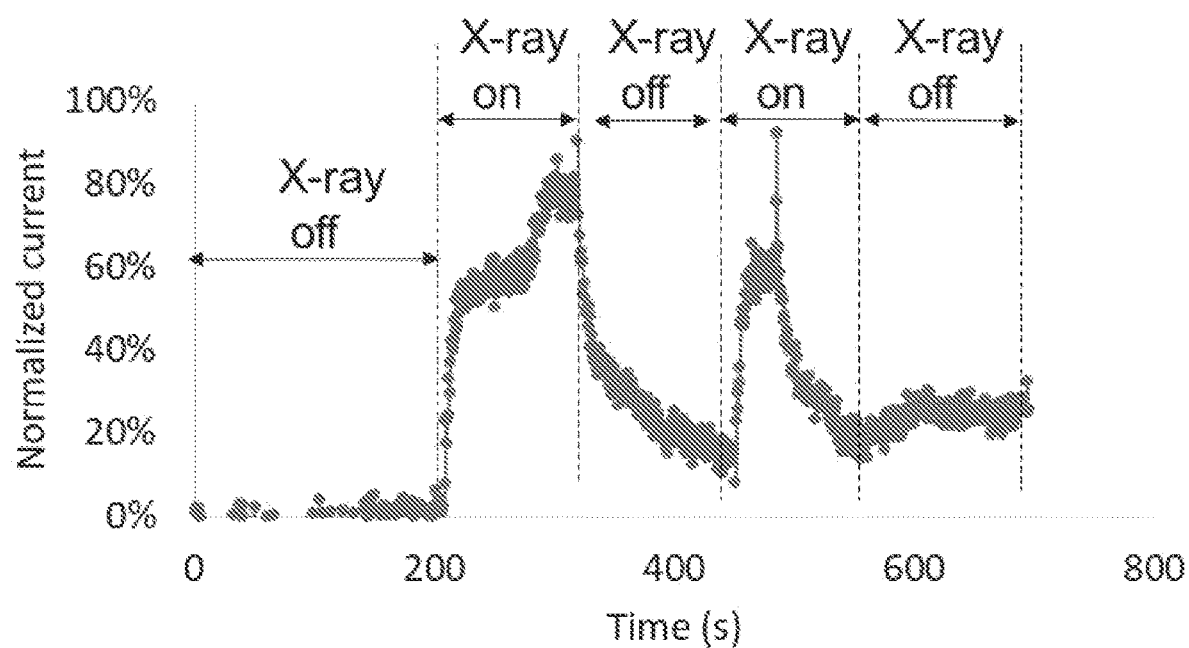
FIG. 22 shows that the perovskite $CH_3NH_3PbBr_3$ battery (under 0 bias) produces prominent current response to an external X-ray source.

In another test, a device comprising a single crystal perovskite ($CH_3NH_3PbBr_3$) was tested. The device had a vertical structure of Ga electrode/perovskite/Ga electrode. A schematic of the device is shown in FIG. 20. A photograph of the device is shown in FIG. 21. The asymmetric Ga electrodes and asymmetric perovskite crystal offer energy potential difference for charge separation and collection at 0V for the battery. The perovskite $CH_3NH_3PbBr_3$ battery (under 0 bias) produces prominent current response to an external X-ray source (FIG. 22).

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A charge or electricity generating device comprising:
a first electrode;
an electron transport layer;
a perovskite layer;
a hole transport layer; and
a second electrode;
wherein the electron transport layer is disposed between the first electrode and the perovskite layer such that the electron transport layer is in physical contact with the first electrode and the perovskite layer;
wherein the perovskite layer is disposed between the electron transport layer and the hole transport layer such that the perovskite layer is in physical contact with the electron transport layer and the hole transport layer;
wherein the hole transport layer is disposed between the second electrode and the perovskite layer such that the hole transport layer is in physical contact with the perovskite layer and the second electrode;
wherein the perovskite layer comprises a perovskite having a crystal lattice comprising a plurality of atoms, wherein at least a portion of the plurality of atoms within the crystal lattice of the perovskite comprise a radioactive isotope having a half-life of 100 days or more, wherein each radioactive isotope replaces one atom that is a non-radioactive counterpart of the radioactive isotope, such that the perovskite intrinsically comprises one or more radioactive isotopes in its crystal lattice; and
wherein:
the perovskite layer comprises an n-type perovskite layer and a p-type perovskite layer;
wherein the n-type perovskite layer comprises the perovskite doped with an n-type dopant or comprises the perovskite with n-type self-doping;
wherein the p-type perovskite layer comprises the perovskite doped with a p-type dopant or comprises the perovskite with p-type self-doping;
wherein the n-type perovskite layer is disposed between the electron transport layer and the p-type perovskite layer such that the n-type perovskite layer is in physical contact with the electron transport layer and the p-type perovskite layer; and
wherein the p-type perovskite layer is disposed between the n-type perovskite layer and the hole transport layer such that the p-type perovskite layer is in physical contact with the n-type perovskite layer and the hole transport layer.

2. The device of claim 1, wherein:
the perovskite layer has an average thickness of from 100 nanometers (nm) to 10 centimeters (cm);
the electron transport layer has an average thickness of from 10 nanometers (nm) to 1000 nm;
the hole transport layer has an average thickness of from 10 nm to 1000 nm;
the first electrode has an average thickness of from 10 nm to 1000 nm;
the second electrode has an average thickness of from 10 nm to 1000 nm;
or a combination thereof.

3. The device of claim 1, wherein:
the n-type perovskite layer has an average thickness of from 100 nm to 10 centimeters (cm);
the n-type dopant is present in the n-type perovskite layer in a concentration of from $10^8$ per cm$^3$ to $10^{18}$ per cm$^3$;
the p-type perovskite layer has an average thickness of from 100 nm to 10 centimeters (cm);
the p-type dopant is present in the p-type perovskite layer in a concentration of from $10^8$ per cm$^3$ to $10^{18}$ per cm$^3$;
or a combination thereof.

4. The device of claim 1, wherein at least one of the first electrode or the second electrode comprises a metal, a radioactive isotope, a transparent conducting oxide, or a combination thereof.

5. The device of claim 1, wherein the first electrode, the second electrode, or a combination thereof comprises $^{63}$Ni.

6. The device of claim 1, wherein the perovskite comprises a material defined by the formula:

[Q][Z][X]$_3$ wherein:
Q is at least one cation comprising an organic group, an inorganic group, or a combination thereof;
Z is at least one cation comprising a metal, a metalloid, or a combination thereof; and
X is at least one anion comprising a halide;
wherein at least a portion of Q, Z, X, or a combination thereof comprises the radioactive isotope having a half-life of 100 days or more.

7. The device of claim 6, wherein:
Q, Z and X are different from each other; and
Q is methylammonium CH$_3$NH$_3$ (MA), formamidinum CH(NH$_2$)$_2$ (FA), n-butylammonium, tetra-butylammonium C$_4$H$_9$NH$_3$ (BA), Cs, or a combination thereof;
Z is Pb, Sn, Cs, or a combination thereof; and
X is I, Cl, Br, or a combination thereof.

8. The device of claim 6, wherein the radioactive isotope is $^{14}$C, $^{36}$Cl, $^{134}$Cs, $^{135}$Cs, $^{137}$Cs, $^3$H, $^{129}$I, $^{202}$Pb, $^{205}$Pb, $^{210}$Pb, $^{113}$Sn, $^{123}$Sn, $^{126}$Sn, or a combination thereof.

9. The device of claim 1, wherein the perovskite comprises a material defined by the formula:

[Q]$_2$[M][M'][X]$_6$ wherein:
Q, M, M' and X are different from each other; and
Q is at least one cation comprising an organic group, an inorganic group, or a combination thereof;
M is at least one cation comprising a metal, a metalloid, or a combination thereof; and
M' is at least one cation comprising a metal, a metalloid, or a combination thereof; and
X is at least one anion comprising a halide;
wherein at least a portion of Q, M, M', X, or a combination thereof comprises the radioactive isotope having a half-life of 100 days or more.

10. The device of claim 9, wherein:
Q is methylammonium $CH_3NH_3$ (MA), formamidinum $CH(NH_2)_2$ (FA), n-butylammonium, tetra-butylammonium $C_4H_9NH_3$ (BA), Cs, or a combination thereof;
M is Cu, Ag, or a combination thereof;
M' is Bi, Ga, In, or a combination thereof; and
X is I, Cl, Br, or a combination thereof.

11. The device of claim 9, wherein the radioactive isotope is $^{108m}Ag$, $^{110m2}Ag$, $^{207}Bi$, $^{208}Bi$, $^{209}Bi$, $^{210m}Bi$, $^{14}C$, $^{36}Cl$, $^{134}Cs$, $^{135}Cs$, $^{137}Cs$, $^{3}H$, $^{129}I$, $^{115}In$, $^{113}Sn$, $^{123}Sn$, $^{126}Sn$, or a combination thereof.

12. The device of claim 1, wherein;
the perovskite comprises $Cs_4Eu[X]_6$, $Cs_4Pb[X]_6$, $CsPb_2[X]_5$, or a combination thereof, wherein X is one or more anions comprising a halide; and
the radioactive isotope is $^{36}Cl$, $^{134}Cs$, $^{135}Cs$, $^{137}Cs$, $^{150}Eu$, $^{152}Eu$, $^{154}Eu$, $^{155}Eu$, $^{129}I$, $^{202}Pb$, $^{205}Pb$, $^{210}Pb$, or a combination thereof.

13. The device of claim 1, wherein the perovskite comprises $MAPbI_3$, $MAPbBr_3$, $MAPbCl_3$, $MAPbBr_{2.94}Cl_{0.06}$, $MAPbBr_{2.85}Cl_{0.15}$, $FA_{0.97}MA_{0.03}PbBr_{2.91}Cl_{0.09}$, $Cs_{0.2}MA_{0.8}PbBr_{2.98}Cl_{0.02}$, $CsPbBr_3$, $FAPbBr_3$, $FA_{0.97}MA_{0.03}PbBr_{2.91}Cl_{0.09}$, $Cs_2AgBiBr_6$, or a combination thereof.

14. The device of claim 13, wherein the radioactive isotope is $^{108m}Ag$, $^{110m2}Ag$, $^{207}Bi$, $^{208}Bi$, $^{209}Bi$, $^{210m}Bi$, $^{14}C$, $^{36}Cl$, $^{134}Cs$, $^{135}Cs$, $^{137}Cs$, $^{3}H$, $^{129}I$, $^{202}Pb$, $^{205}Pb$, $^{210}Pb$, or a combination thereof.

15. The device of claim 1, wherein the radioactive isotope replaces 0.1% or more of the non-radioactive counterpart atom in the crystal lattice of the perovskite.

16. The device of claim 1, wherein the radioactive isotope emits alpha particles, beta particles, gamma photons, or a combination thereof.

17. The device of claim 1, wherein the device has a radioactivity density of from $1\times10^8$ Becquerel (Bq) per cubic centimeter ($cm^3$) to $1\times10^{13}$ $Bq/cm^3$.

18. A charge or electricity generating device comprising:
a first electrode;
an n-type perovskite layer;
a p-type perovskite layer; and
a second electrode;
wherein the n-type perovskite layer is disposed between the first electrode and the p-type perovskite layer such that the n-type perovskite layer is in physical contact with the first electrode and the p-type perovskite layer;
wherein the p-type perovskite layer is disposed between the n-type perovskite layer and the second electrode such that the p-type perovskite layer is in physical contact with the n-type perovskite layer and the second electrode;
wherein the n-type perovskite layer comprises a perovskite doped with an n-type dopant or comprises the perovskite with n-type self-doping;
wherein the p-type perovskite layer comprises the perovskite doped with a p-type dopant or comprises the perovskite with p-type self-doping;
wherein at least one of the n-type perovskite layer or the p-type perovskite layer comprises the perovskite having a crystal lattice comprising a plurality of atoms, wherein at least a portion of the plurality of atoms within the crystal lattice of the perovskite of the at least one of the n-type perovskite layer or the p-type perovskite layer comprise a radioactive isotope having a half-life of 100 days or more, wherein each radioactive isotope replaces one atom that is a non-radioactive counterpart of the radioactive isotope, such that the perovskite of the at least one of the n-type perovskite layer or the p-type perovskite layer intrinsically comprises one or more radioactive isotopes in its crystal lattice.

* * * * *

UNITED STATES PATENT AND TRADEMARK OFFICE
CERTIFICATE OF CORRECTION

PATENT NO. : 12,213,327 B2
APPLICATION NO. : 17/921522
DATED : January 28, 2025
INVENTOR(S) : Lei Raymond Cao et al.

Page 1 of 1

It is certified that error appears in the above-identified patent and that said Letters Patent is hereby corrected as shown below:

In the Claims

Column 32, Line 44, Claim 7: delete "formamidinum" and replace it with --formamidinium--

Column 33, Line 2, Claim 10: delete "formamidinum" and replace it with --formamidinium--

Column 33, Line 24, Claim 14: delete "wherein;" and replace it with --wherein:--

Signed and Sealed this
Twenty-second Day of April, 2025

Coke Morgan Stewart
*Acting Director of the United States Patent and Trademark Office*